(12) United States Patent
Park et al.

(10) Patent No.: US 10,891,988 B2
(45) Date of Patent: Jan. 12, 2021

(54) MEMORY MODULES AND MEMORY SYSTEMS INCLUDING A POWER MANAGEMENT INTEGRATED CIRCUIT

(71) Applicant: SAMSUNG ELECTRONICS CO., LTD., Suwon-si (KR)

(72) Inventors: Hwan-Wook Park, Seoul (KR); Yong-Jin Kim, Incheon (KR); Jin-Seong Yun, Suwon-si (KR); Kyu-Dong Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/552,506

(22) Filed: Aug. 27, 2019

(65) Prior Publication Data

US 2019/0385645 A1    Dec. 19, 2019

Related U.S. Application Data

(63) Continuation-in-part of application No. 15/956,267, filed on Apr. 18, 2018, now Pat. No. 10,410,686.

(30) Foreign Application Priority Data

Oct. 13, 2017  (KR) .................. 10-2017-0133117

(51) Int. Cl.
  *G11C 5/14*     (2006.01)
  *G11C 5/06*     (2006.01)
  (Continued)

(52) U.S. Cl.
  CPC .............. *G11C 5/063* (2013.01); *G11C 5/04* (2013.01); *G11C 5/147* (2013.01); *G11C 11/4074* (2013.01)

(58) Field of Classification Search
  CPC ........... G11C 5/063; G11C 5/147; G11C 5/04; G11C 11/4074; G11C 7/225;
  (Continued)

(56) References Cited

U.S. PATENT DOCUMENTS 5,563,838 A    10/1996  Mart et al.
7,360,104 B2    4/2008  Harris et al.
(Continued)

FOREIGN PATENT DOCUMENTS

KR    1019990010766    2/1999

OTHER PUBLICATIONS

Ex Parte Quayle Office Action dated Mar. 21, 2019 in Corresponding U.S. Appl. No. 15/956,267.

*Primary Examiner* — Tha-O H Bui

(74) *Attorney, Agent, or Firm* — F. Chau & Associates, LLC

(57) ABSTRACT

A memory module includes a circuit board, a plurality of memory devices, and a power management integrated circuit (PMIC). The circuit board includes first connectors, a second connector, and a third connector connected to an external device. The plurality of memory devices are mounted on the circuit board, and connected to the first connectors. The PMIC receives a first voltage through the second connector, generates a second voltage using the first voltage, and provides the second voltage to the plurality of memory devices The PMIC adjusts the second voltage based on a signal received through the third connector such that a voltage difference of the first voltage and the second voltage is reduced in a training mode of the memory module.

20 Claims, 23 Drawing Sheets

(51) Int. Cl.
*G11C 11/4074* (2006.01)
*G11C 5/04* (2006.01)

(58) Field of Classification Search
CPC ............ G11C 2207/105; G11C 29/021; G11C 29/028; G11C 11/4076; G11C 7/222
USPC ......................................................... 365/226
See application file for complete search history.

(56) References Cited

U.S. PATENT DOCUMENTS

| | | |
|---|---|---|
| 8,018,753 B2 | 9/2011 | Carr et al. |
| 8,582,388 B1 | 11/2013 | Hu et al. |
| 8,861,277 B1 | 10/2014 | Rategh et al. |
| 9,229,747 B2 | 1/2016 | Berke et al. |
| 9,240,248 B2 | 1/2016 | Rategh et al. |
| 9,576,615 B1 | 2/2017 | Mahran et al. |
| 9,606,598 B2 | 3/2017 | Luo et al. |
| 9,627,028 B2 | 4/2017 | Mera et al. |
| 2003/0035328 A1* | 2/2003 | Hamamatsu ............ G11C 29/46 365/200 |
| 2003/0236641 A1* | 12/2003 | Liou .................... G11C 7/1006 702/89 |
| 2019/0115053 A1 | 4/2019 | Park et al. |

* cited by examiner

○ Populated ball
+ Ball not populated

MEMORY MODULES AND MEMORY SYSTEMS INCLUDING A POWER MANAGEMENT INTEGRATED CIRCUIT

CROSS-REFERENCE TO RELATED APPLICATION(S)

This application is a Continuation-in-Part (CIP) of U.S. patent application Ser. No. 15/956,267 filed on Apr. 18, 2018, issued as U.S. Pat. No. 10,410,686, which claims priority under 35 U.S.C. § 119 to Korean Patent Application No. 10-2017-0133117, filed on Oct. 13, 2017 in the Korean Intellectual Property Office (KIPO), the disclosures of which are incorporated by reference herein in their entireties.

TECHNICAL FIELD

Exemplary embodiments of the inventive concept relate to a memory device, and more particularly, to memory modules and memory systems including the memory modules.

DISCUSSION OF RELATED ART

A memory device may be implemented using a semiconductor such as silicon (Si), germanium (Ge), gallium arsenide (GaAs), indium phosphide (InP), or the like. Memory devices are typically divided into volatile memory devices and nonvolatile memory devices.

A volatile memory device refers to a memory device in which stored data is lost when a power supply is shut down. On the other hand, a nonvolatile memory device refers to a memory device that retains stored data when a power supply is shut down. Because a dynamic random access memory (DRAM), which is a kind of volatile memory device, has a high access speed, the DRAM is widely used as a working memory, a buffer memory, a main memory, or the like of a computing system. Because a DRAM memory cell generally includes a capacitor and a transistor, it is difficult to reduce a cell size thereof. Thus, it may be difficult to implement a high-capacity DRAM within a limited area. For high capacity, a plurality of DRAMs may be provided in the form of a memory module.

SUMMARY

According to an exemplary embodiment of the inventive concept, a memory module includes a circuit board, a plurality of memory devices, and a power management integrated circuit (PMIC). The circuit board includes first connectors, a second connector, and a third connector connected to an external device. The plurality of memory devices are mounted on the circuit board, and connected to the first connectors. The PMIC receives a first voltage through the second connector, generates a second voltage using the first voltage, and provides the second voltage to the plurality of memory devices The PMIC adjusts the second voltage based on a signal received through the third connector such that a voltage difference of the first voltage and the second voltage is reduced in a training mode of the memory module.

According to an exemplary embodiment of the inventive concept, a memory module includes a circuit board, a plurality of memory devices, a power management integrated circuit (PMIC), and a driver. The circuit board includes first connectors, a second connector, and a third connector connected to an external device. The plurality of memory devices are mounted on a first surface of the circuit board, and are connected to the first connectors. The PMIC is mounted on a second surface of the circuit board. The PMIC receives a first voltage through the second connector, generates a second voltage using the first voltage, and provides the second voltage to the plurality of memory devices. The driver is mounted on the on the first surface of the circuit board, and controls the plurality of memory devices and the PMIC based on a command and an address signal received through the third connector. The PMIC adjusts the second voltage based on a signal received through the third connector such that a voltage difference of the first voltage and the second voltage is reduced in a training mode of the memory module. The plurality of memory devices includes a first group of memory devices disposed between the driver and a first edge portion of the first surface and a second group of memory devices disposed between the driver and a second edge portion of the first surface. The first surface is opposed to the second surface.

According to an exemplary embodiment of the inventive concept, a memory system includes a memory module and a memory controller to control the memory module. The memory module includes a circuit board, a plurality of memory devices, and a power management integrated circuit (PMIC). The circuit board includes first connectors, a second connector, and a third connector connected to the memory controller. The plurality of memory devices are mounted on the circuit board, and connected to the first connectors. The PMIC is mounted on the circuit board. The PMIC receives a first voltage through the second connector, generates a second voltage using the first voltage, and provides the second voltage to the plurality of memory devices. The PMIC adjusts the second voltage based on a signal received through the third connector such that a voltage difference of the first voltage and the second voltage is reduced in a training mode of the memory module.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
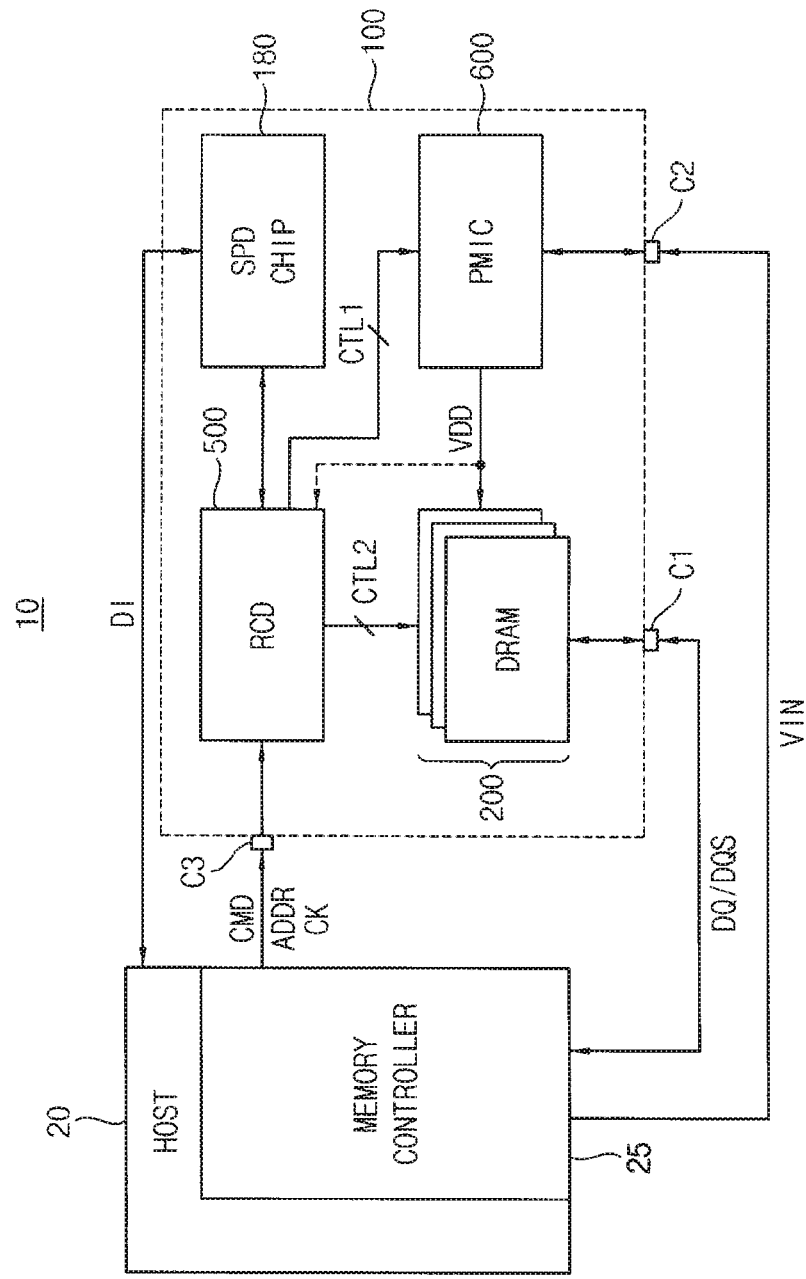
FIG. 1 is a block diagram illustrating a memory system according to exemplary embodiments of the inventive concept.

Exemplary embodiments of the inventive concept provide a memory module capable of enhancing performance and increasing yield.

Exemplary embodiments of the inventive concept also provide a method of operating the memory module capable of enhancing performance and increasing yield.

Exemplary embodiments of the inventive concept further provide a test system of the memory module capable of enhancing performance and increasing yield.

Exemplary embodiments of the inventive concept will be described more fully hereinafter with reference to the accompanying drawings. Like reference numerals may refer to like elements throughout this application.

FIG. 1 is a block diagram illustrating a memory system according to exemplary embodiments of the inventive concept.

Referring to FIG. 1, a memory system 10 includes a host 20 and a memory module 100. The host 20 may include a memory controller 25.

The memory module 100 may include a driver 500 (e.g., a registered clock driver (RCD)), a serial presence detect (SPD) chip 180, memory devices 200, and a power management integrated circuit (PMIC) 600. The memory module 100 may be connected to the memory controller 25 through first connectors C1, a second connector C2, and a third connector C3.

The driver 500, under control of the memory controller 25, may control the memory devices 200 and the PMIC 600. For example, the driver 500 may receive an address ADDR, a command CMD, and a clock signal CK from the memory controller 25 through the third connector C3. In response to the received signals, the driver 500 may control the memory devices 200 such that data received through a data signal DQ and a data strobe signal DQS is written in the memory devices 200, or data stored in the memory devices 200 is output through the data signal DQ and the data strobe signal DQS. For example, the driver 500 may transmit the address ADDR, the command CMD, and the clock signal CK from the memory controller 25 to the memory devices 200.

The memory devices 200 may write data received through the data signal DQ and the data strobe signal DQS under control of the driver 500. Alternatively, the memory devices 200 may output the written data through the data signal DQ and the data strobe signal DQS under control of the driver 500.

For example, the memory devices 200 may include a volatile memory device such as a dynamic random-access memory (DRAM), a static random-access memory (SRAM), a synchronous dynamic random-access memory (SDRAM), etc. For example, the memory devices 200 may include DRAM-based volatile memory devices. For example, the memory devices 200 may include a double data rate 5 (DDR5) SDRAM.

The SPD chip 180 may be a programmable read only memory (e.g., electrically erasable programmable read-only memory (EEPROM)). The SPD chip 180 may include initial information or device information DI of the memory module 100. In exemplary embodiments of the inventive concept, the SPD chip 180 may include the initial information or the device information DI such as a module form, a module configuration, a storage capacity, a module type, an execution environment, or the like of the memory module 100.

When the memory system 10 including the memory module 100 is booted up, the host 20 may read the device information DI from the SPD chip 180 and may recognize the memory module 100 based on the device information DI. The host 20 may control the memory module 100 based on the device information DI from the SPD chip 180. For example, the host 20 may recognize a type of the memory devices 200 included in the memory module 100 based on the device information DI from the SPD chip 180.

In exemplary embodiments of the inventive concept, the SPD chip 180 may communicate with the host 20 through a serial bus. For example, the host 20 may exchange a signal with the SPD chip 180 through the serial bus. The SPD chip 180 may also communicate with the driver 500 through the serial bus. The serial bus may include at least one of 2-line serial buses such as an inter-integrated circuit (I2C), a system management bus (SMBus), a power management bus (PMBus), an intelligent platform management interface (IPMI), a management component transport protocol (MCTP), or the like.

The driver 500 may control the PMIC 600 through a first control signal CTL1, and may control the memory devices 200 through a second control signal CTL2. The second control signal CTL2 may include the address signal ADDR, the command CMD, and the clock signal CK.

The PMIC 600 may receive an input voltage VIN through the second connector C2 from the host 20, generate a power supply voltage VDD based on the input voltage VIN, and provide the power supply voltage VDD to the memory devices 200. The memory devices 200 may operate based on the power supply voltage VDD.

The PMIC 600 may adjust the power supply voltage VDD (e.g., a second voltage) based on a signal received through the third connector C3 such that a voltage difference of the input voltage VIN (e.g., a first voltage) and the power supply voltage VDD is reduced in a training mode. The input voltage VIN may be referred to as a host voltage and the power supply voltage VDD may be referred to a memory voltage.

Figure 2:
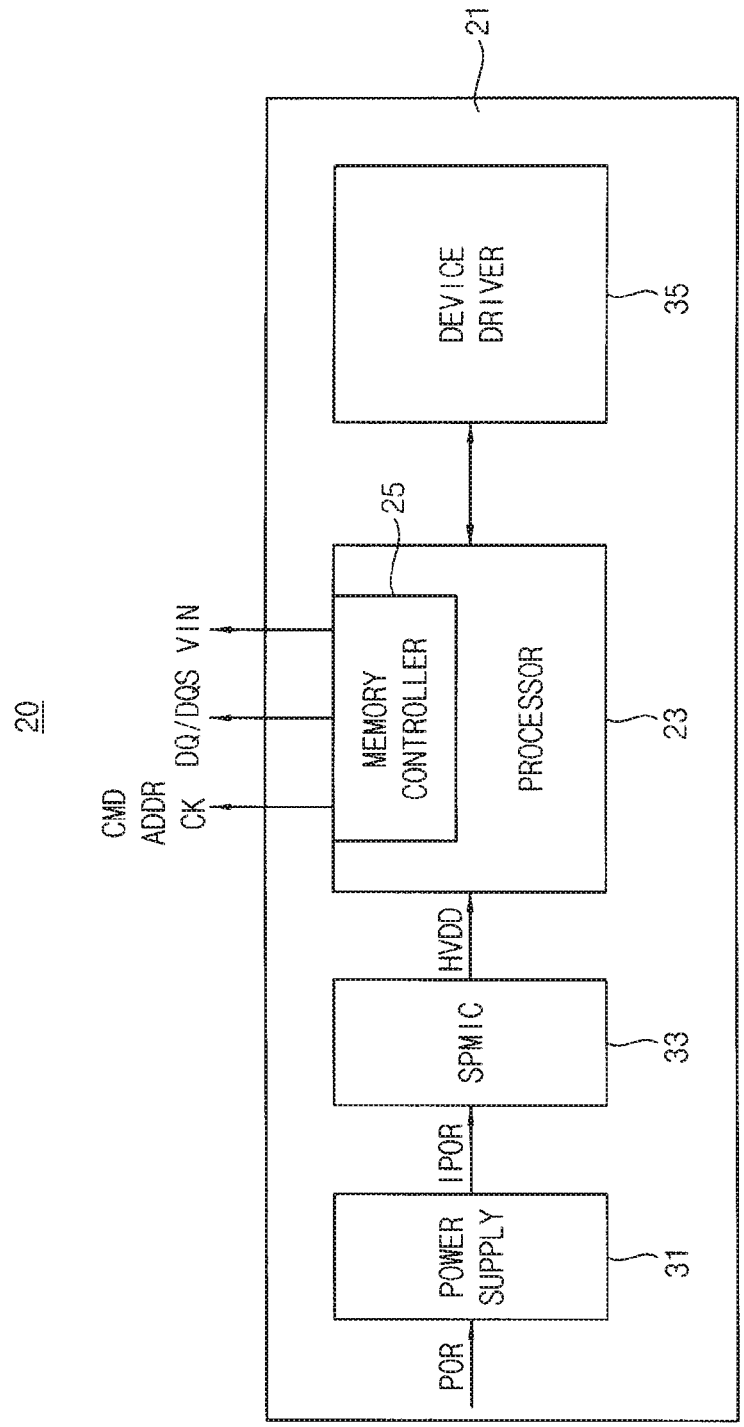
FIG. 2 illustrates a host in the memory system of FIG. 1 according to exemplary embodiments of the inventive concept.

FIG. 2 illustrates a host in the memory module of FIG. 1 according to exemplary embodiments of the inventive concept.

Referring to FIG. 2, the host 20 may include a power supply 31, a system PMIC (SPMIC) 33, a processor 23, and a device driver 35 mounted on a circuit board 21.

The circuit board 21 may include a plate composed of dielectric such as plastic and wirings that electrically connect the power supply 31, the SPMIC 33, the processor 23, and the device driver 35.

The power supply 31 receives a power POR from an external source, and outputs an internal power IPOR based on the power POR. The SPMIC 33 receives the internal power IPOR, generates a host voltage HVDD based on the internal power IPOR, and provides the host voltage HVDD to the processor 23.

The processor 23 may include the memory controller 25. The processor 23 may access the memory module 100 of FIG. 1 through the memory controller 25. The memory controller 25 provides the address signal ADDR, the command CMD, and the clock signal CK to the memory devices 200, provides the input voltage VIN to the PMIC 600, and exchanges the data signal DQ and the data strobe signal DQS with the memory devices 200. The processor 23 may access peripheral devices through the device driver 35. The peripheral devices may include a storage device and a user interface.

The memory controller 25 may be connected to the first connectors C1, the second connector C2, and the third connector C3 of the memory module 100 through wirings in the circuit board 21.

For example, the memory controller 25 may exchange signals with the memory module 100 by using the host voltage HVDD received from the SPMIC 33 as a high level voltage and the ground voltage as a low level voltage.

Figure 3A:
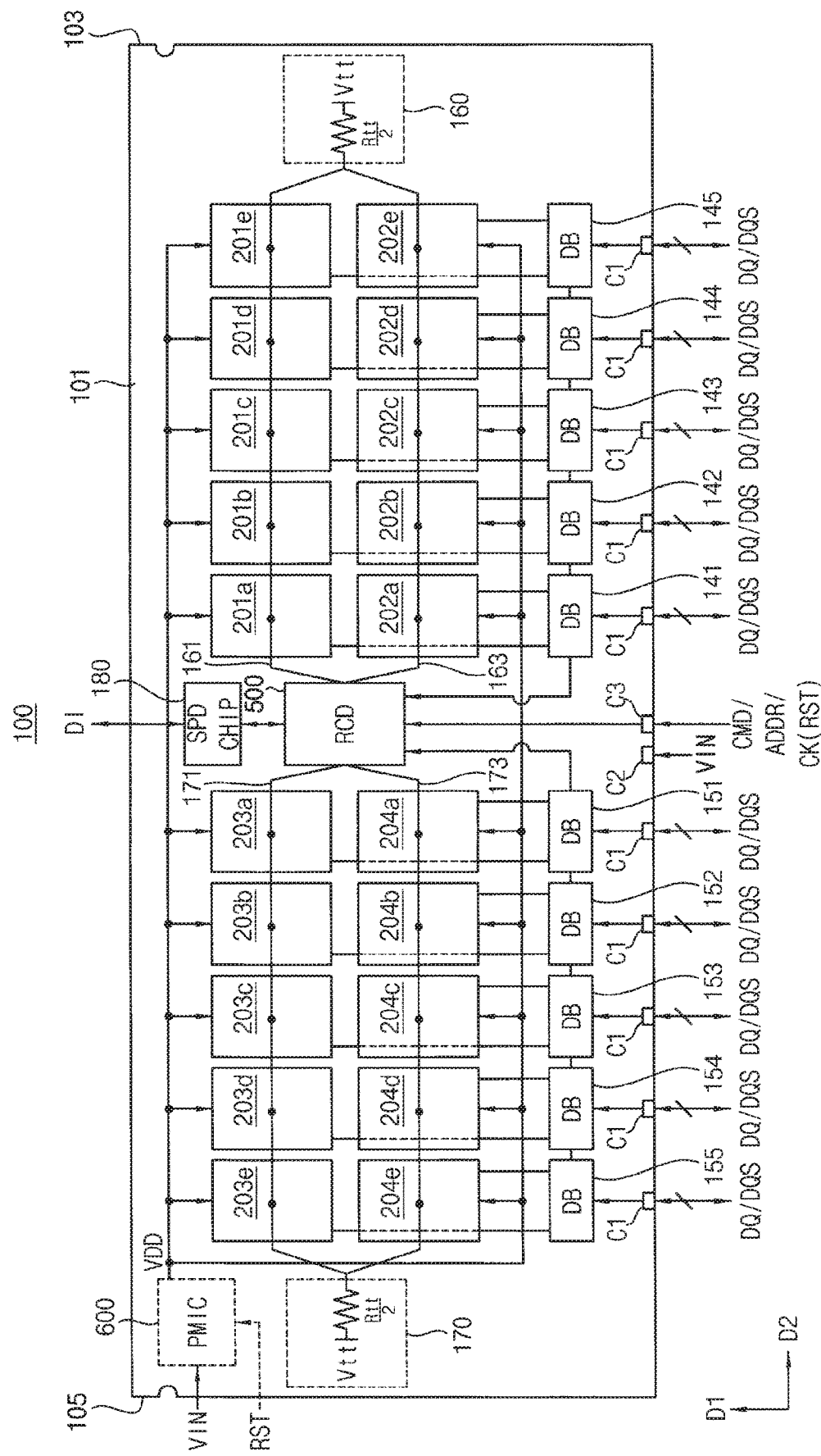
FIG. 3A is a block diagram illustrating a memory module of FIG. 1 according to exemplary embodiments of the inventive concept.

FIG. 3A is a block diagram illustrating a memory module of FIG. 1 according to exemplary embodiments of the inventive concept.

Referring to FIG. 3A, the memory module 100 includes the driver 500 disposed (or mounted) in a circuit board 101, a plurality of memory devices 201a~201e, 202a~202e, 203a~203e, and 204a~204e, a plurality of data buffers 141~145 and 151~155, module resistance units 160 and 170, and the PMIC 600.

The circuit board 101 may include the first connectors C1, the second connector C2, and the third connector C3 which are configured to be connected to the host 20. The circuit board 101 may include a plate composed of dielectric such as plastic, connecting devices which are configured to be connected to the plurality of memory devices 201a~201e, 202a~202e, 203a~203e, and 204a~204e, the driver 500, and the PMIC 600, and wirings that electrically connect the first connectors C1, the second connector C2, and the third connector C3. The plurality of memory devices 201a~201e, 202a~202e, 203a~203e, and 204a~204e may receive the data signal DQ and the data strobe signal DQS through the first connectors C1.

The driver 500 may be connected to the third connector C3 through wirings in the circuit board 101. The PMIC 600 may be connected to the second connector C2 through wirings in the circuit board 101 and receive the input voltage VIN from the host 20. The PMIC 600 may generate and output various voltages including the power supply voltage VDD in cooperation with capacitors and inductors which are mounted on the circuit board 101. The PMIC 600 may receive a reset signal RST directly through the third connector C3.

The plurality of memory devices 201a~201e, 202a~202e, 203a~203e, and 204a~204e, and the driver 500 may exchange signals with the host 20 by using the power supply voltage VDD as a high level voltage and the ground voltage as a low level voltage. For example, the memory devices 201a~201e, 202a~202e, 203a~203e, and 204a~204e and the driver 500 may exchange the data signal DQ and the data strobe signal DQS with the memory controller 25 through the first connectors C1 based on the power supply voltage VDD. The driver 500 may exchange various signal including the command CMD and the address signal ADDR with the memory controller 25 based on the power supply voltage VDD.

Here, the circuit board 101 may be a printed circuit board that extends in a second direction D2, perpendicular to a first direction D1, between a first edge portion 103 and a second edge portion 105 of the first direction D1. The driver 500 may be disposed on a center of the circuit board 101. The plurality of memory devices 201a~201e, 202a~202e, 203a~203e, and 204a~204e may be arranged in a plurality of rows between the driver 500 and the first edge portion 103 and between the driver 500 and the second edge portion 105. In this case, the memory devices 201a~201e and 202a~202e may be arranged along a plurality of rows between the driver 500 and the first edge portion 103. The memory devices 203a~203e and 204a~204e may be arranged along a plurality of rows between the driver 500 and the second edge portion 105. The driver 500 and the memory devices 201a~201e, 202a~202e, 203a~203e, and 204a~204e may be disposed in a first surface of the circuit board 101.

A portion of the memory devices 201a~201e and 202a~202e may be an error correction code (ECC) memory device. The ECC memory device may perform an ECC encoding operation to generate parity bits about data to be written at the memory cells and an ECC decoding operation to correct an error occurring in the data read from the memory cells.

Each of the plurality of memory devices 201a~201e, 202a~202e, 203a~203e, and 204a~204e may be coupled to correspond to one of the data buffers 141~145 and 151~155 through a data transmission line for receiving/transmitting the data signal DQ and the data strobe signal DQS.

The driver 500 may provide a command/address signal to the memory devices 201a~201e through a command/address transmission line 161 and may provide a command/address signal to the memory devices 202a~202e through a command/address transmission line 163. In addition, the driver 500 may provide a command/address signal to the memory devices 203a~203e through a command/address transmission line 171 and may provide a command/address signal to the memory devices 204a~204e through a command/address transmission line 173.

The command/address transmission lines 161 and 163 may be connected in common to the module resistance unit 160 disposed to be adjacent to the first edge portion 103, and the command/address transmission lines 171 and 173 may be connected in common to the module resistance unit 170 disposed to be adjacent to the second edge portion 105.

Each of the module resistance units 160 and 170 may include a termination resistor Rtt/2 connected to a termination voltage Vtt. In this case, an arrangement of the module resistance units 160 and 170 may reduce the number of module resistance units, thus reducing an area where termination resistors are disposed.

In addition, each of the plurality of memory devices 201a~201e, 202a~202e, 203a~203e, and 204a~204e may be a DDR5 SDRAM.

The SPD chip 180 may be disposed to be adjacent to the driver 500 and the PMIC 600 may be disposed on a second surface of the circuit board 101. The PMIC 600 may generate the power supply voltage VDD based on the input voltage VIN and may provide the power supply voltage VDD to the memory devices 201a~201e, 202a~202e, 203a~203e, and 204a~204e.

Figure 3B:
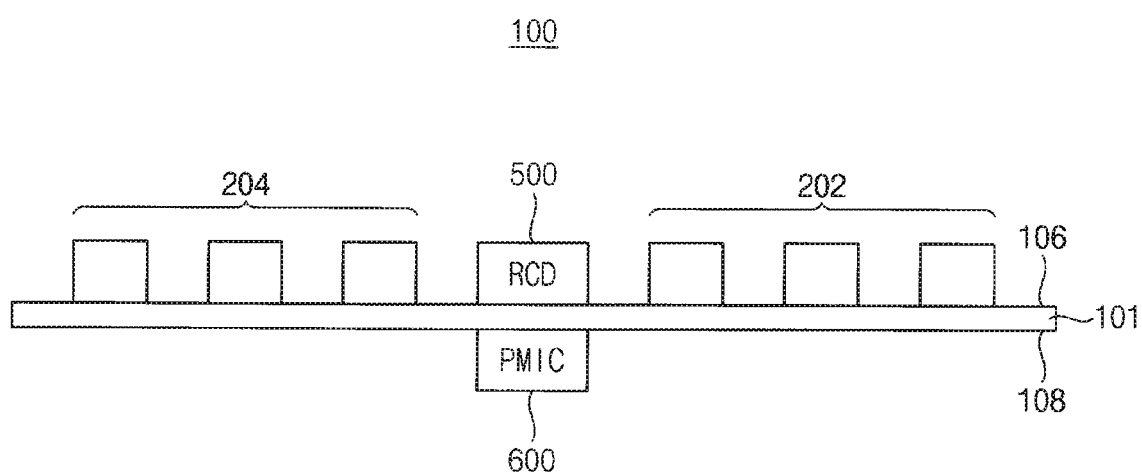
FIG. 3B illustrates a cross-sectional view of the memory module of FIG. 3A according to exemplary embodiments of the inventive concept.

FIG. 3B illustrates a cross-sectional view of the memory module of FIG. 3A according to exemplary embodiments of the inventive concept.

Referring to FIG. 3B, the memory module 100 may include the driver 500 and memory devices 202 and 204 disposed on a first surface 106 of the circuit board 101. The memory module 100 may further include the PMIC 600 disposed on a second surface 108 of the circuit board 101. The first surface 106 and the second surface 108 may be opposed to each other. Memory devices may be also disposed on the second surface 108.

In the memory system of FIG. 1, the memory controller 25 may use the host voltage HVDD as a high-level voltage when exchanging signals through the first connectors C1 or the third connector C3. The memory devices 200 or the driver 500 may use the power voltage VDD as a high-level voltage when exchanging signals through the first connectors C1 or the third connector C3.

When there is a voltage difference between the host voltage HVDD and the power supply voltage VDD, unintended direct current may flow between the memory devices 200 and the memory controller 25 or between the driver 500 and the memory controller 25. The unintended direct current may cause power consumption. In addition, the unintended direct current may operate as a stress to the memory module 100 or the memory controller 25, and may degrade performance of the memory module 100 or the memory controller 25.

For solving these problems, the memory module 100 according to exemplary embodiments of the inventive concept may detect a voltage difference between the host voltage HVDD and the power supply voltage VDD, and may adjust the power supply voltage VDD such that the voltage difference between the host voltage HVDD and the power supply voltage VDD is reduced in a training mode.

Figure 4:
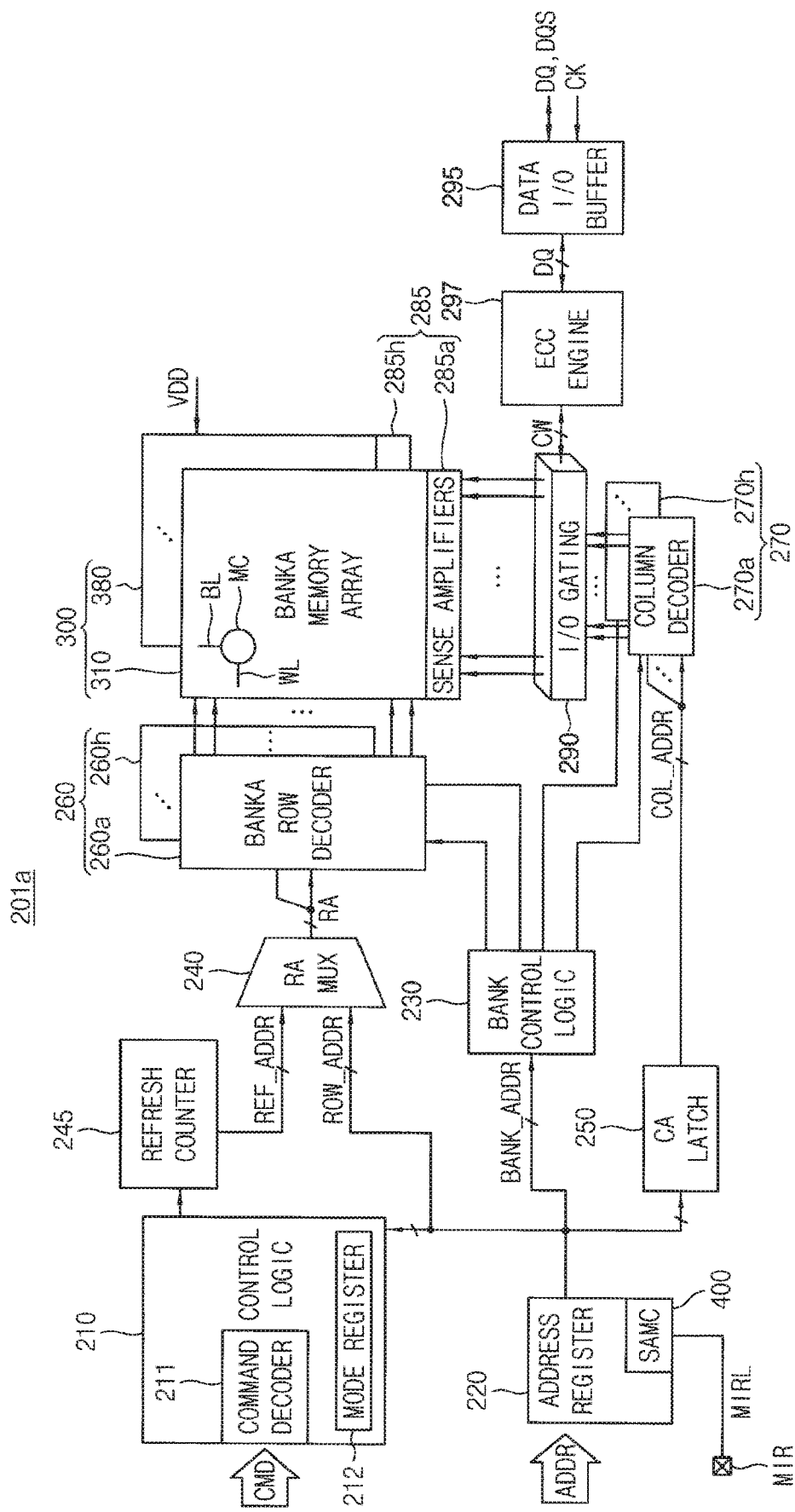
FIG. 4 is a block diagram illustrating a memory device in the memory module of FIG. 3A according to exemplary embodiments of the inventive concept.

FIG. 4 is a block diagram illustrating a memory device in the memory module of FIG. 3A according to exemplary embodiments of the inventive concept.

Referring to FIG. 4, the memory device 201a may include a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, and an ECC engine 297.

The memory cell array 300 may include first through eighth bank arrays 310~380. The row decoder 260 may include first through eighth bank row decoders 260a~260h coupled to the first through eighth bank arrays 310~380, respectively, the column decoder 270 may include first through eighth bank column decoders 270a~270h coupled to the first through eighth bank arrays 310~380, respectively, and the sense amplifier unit 285 may include first through eighth bank sense amplifiers 285a~285h coupled to the first through eighth bank arrays 310~380, respectively. The first through eighth bank arrays 310~380, the first through eighth bank row decoders 260a~260h, the first through eighth bank column decoders 270a~270h, and the first through eighth bank sense amplifiers 285a~285h may form first through eighth banks. Each of the first through eighth bank arrays 310~380 may include a plurality of word-lines WL, a plurality of bit-lines BL, and a plurality of memory cells MC formed at intersections of the word-lines WL and the bit-lines BL.

Although the memory device 201a is illustrated in FIG. 4 as including eight banks, the memory device 201a may include any number of banks.

The address register 220 may receive the address ADDR including a bank address BANK_ADDR, a row address ROW_ADDR, and a column address COL_ADDR from the driver 500. The address register 220 may provide the received bank address BANK_ADDR to the bank control logic 230, may provide the received row address ROW_ADDR to the row address multiplexer 240, and may provide the received column address COL_ADDR to the column address latch 250.

The address register 220 may include a selective address mirroring circuit (SAMC) 400. The SAMC 400 is connected to a mirror pin MIR and may operate in one of a mirrored mode and a standard mode based on a voltage level MIRL of the mirror pin MIR. If the mirror pin MIR is connected to a power supply voltage, the SAMC 400 operates in the mirrored mode and changes some bits of the address signal ADDR, which are not used for setting the command, to corresponding mirrored address bits. If the mirror pin MIR is connected to a ground voltage, the SAMC 400 operates in the standard mode and maintains bits of the address signal ADDR.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line WL corresponding to the row address RA. For example, the activated bank row decoder may generate a word-line driving voltage based on the power supply voltage VDD and may apply the word-line driving voltage to the word-line WL corresponding to the row address RA.

The column address latch 250 may receive the column address COL_ADDR from the address register 220, and may temporarily store the received column address COL_ADDR. In exemplary embodiments of the inventive concept, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310~380, and write drivers for writing data to the first through eighth bank arrays 310~380.

Data to be read from one of the first through eighth bank arrays 310~380 may be sensed by a sense amplifier coupled to the one bank array from which the data is to be read, and may be stored in the read data latches. The data stored in the read data latches may be provided to the memory controller 25 via the data I/O buffer 295 after the ECC engine 297 performs an ECC decoding on the data (e.g., a codeword CW). Data to be written in one of the first through eighth bank arrays 310~380 may be provided to the data I/O buffer 295 from the memory controller 25. The ECC engine 297 performs an ECC encoding on the data provided to the data I/O buffer 295, and the ECC engine 297 provides the encoded data (e.g., the codeword CW) to the I/O gating circuit 290.

The data I/O buffer 295, in a write operation, provides the data signal DQ to the ECC engine 297. The data I/O buffer 295, in a read operation, receives the data signal DQ from the ECC engine 297 and provides the data signal DQ and the date strobe signal DQS to the memory controller 25.

The control logic circuit 210 may control operations of the memory device 201a. For example, the control logic circuit 210 may generate control signals for the memory device 201a to perform the write operation or the read operation. The control logic circuit 210 may include a command decoder 211 that decodes the command CMD received from the memory controller 25 through the driver 500 and a mode register 212 that sets an operation mode of the memory device 201a. For example, the command decoder 211 may generate the control signals corresponding to the command CMD by decoding a write enable signal, a row address strobe signal, a column address strobe signal, a chip select signal, etc.

Figure 5:
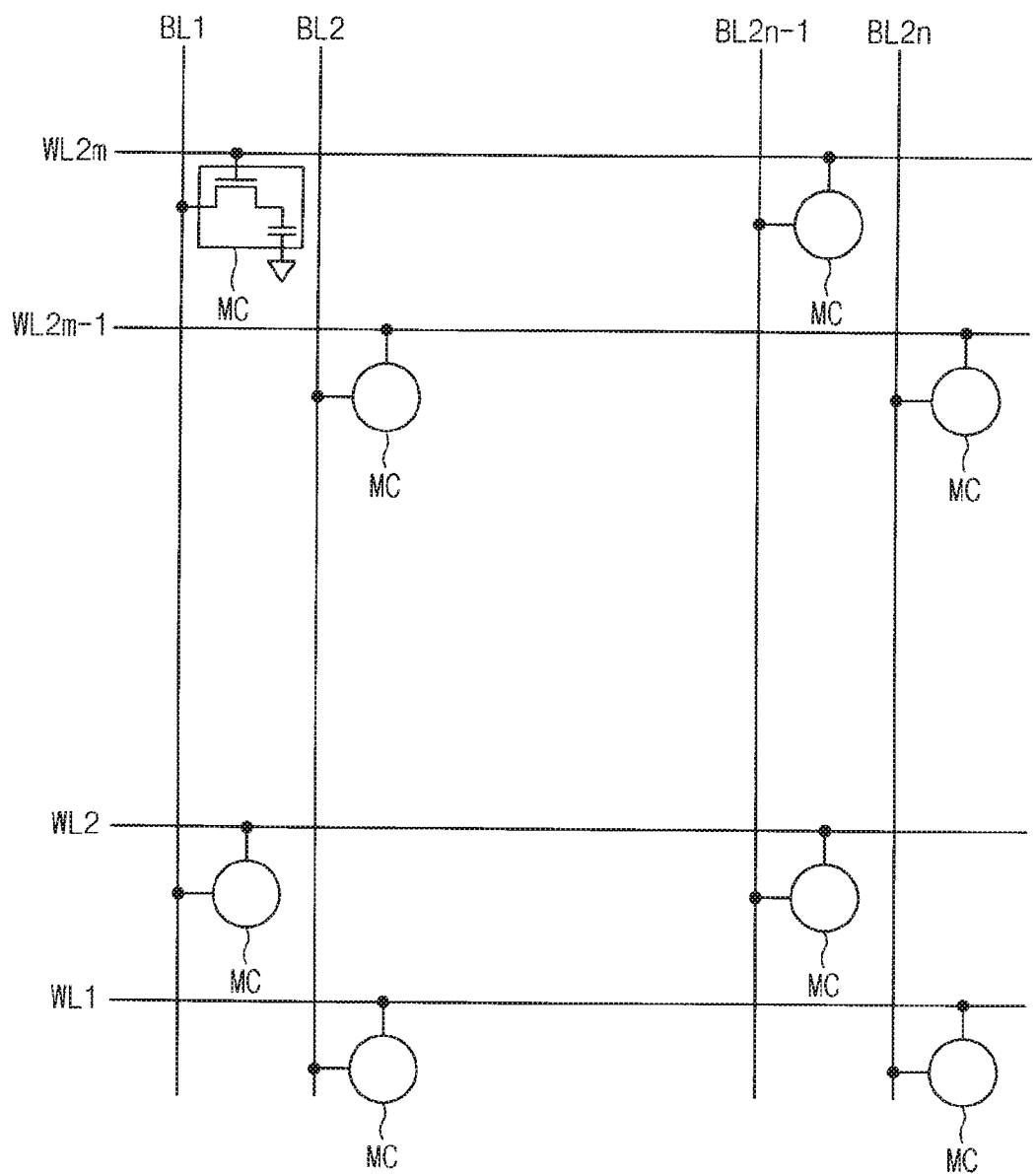
FIG. 5 illustrates a first bank array of the memory device of FIG. 4 according to exemplary embodiments of the inventive concept.

FIG. 5 illustrates a first bank array of the memory device of FIG. 4 according to exemplary embodiments of the inventive concept.

Referring to FIG. 5, the first bank array 310 includes a plurality of word-lines WL1~WL2m (where m is a natural number greater than two), a plurality of bit-lines BL1~BL2n (where n is a natural number greater than two), and a plurality of memory cells MCs disposed near intersections between the word-lines WL1~WL2m and the bit-lines BL1~BL2n. In an exemplary embodiment of the inventive concept, each of the plurality of memory cells MCs may include a DRAM cell structure. The plurality of word-lines WL1~WL2m to which the plurality of memory cells MCs are connected may be referred to as rows of the first bank array 310 and the plurality of bit-lines BL1~BL3n to which the plurality of memory cells MCs are connected may be referred to as columns of the first bank array 310.

Figure 6:
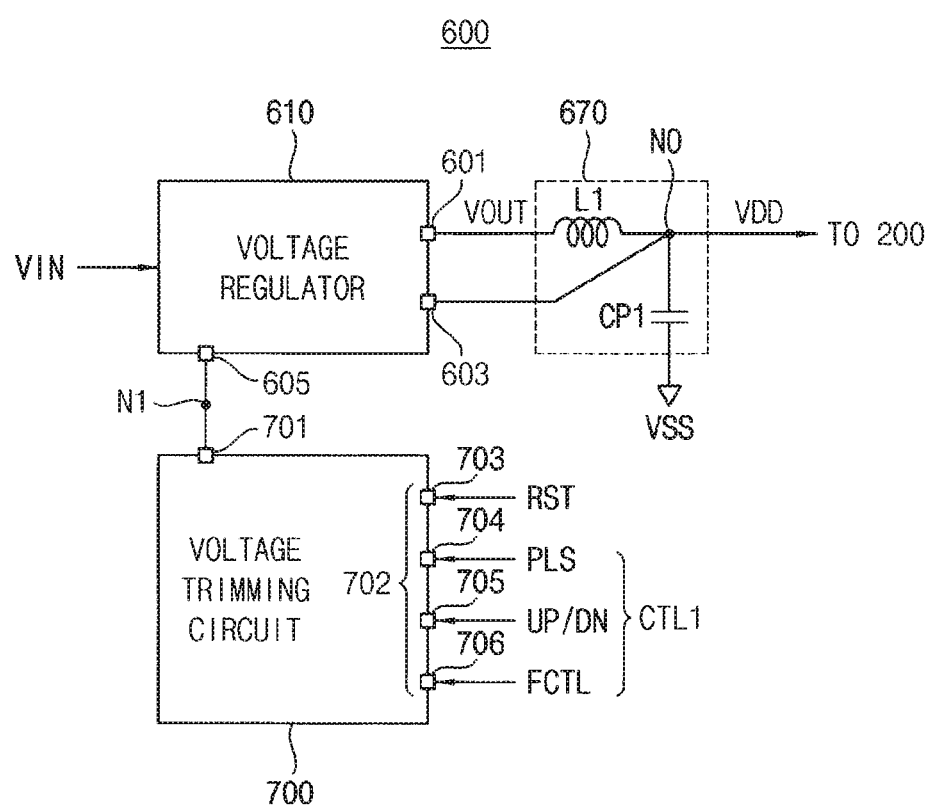
FIG. 6 is a block diagram illustrating a power management integrated circuit (PMIC) in the memory module of FIG. 1 according to exemplary embodiments of the inventive concept.

FIG. 6 is a block diagram illustrating a PMIC in the memory module of FIG. 1 according to exemplary embodiments of the inventive concept.

Referring to FIG. 6, the PMIC 600 may include a voltage regulator 610, a first low-pass filter 670, and a voltage trimming circuit 700.

The voltage regulator 610 generates an output voltage VOUT based on the input voltage VIN and outputs the output voltage VOUT at an output terminal 601. The first low-pass filter 670 filters high-frequency harmonic components of the output voltage VOUT and provides the power supply voltage VDD at an output node NO.

The first low-pass filter 670 includes an inductor L1 and a capacitor CP1. The inductor L1 is coupled between the output terminal 601 and the output node NO. The capacitor CP1 is coupled between the output node NO and a ground voltage VSS. The voltage regulator 610 receives the power supply voltage VDD through a feedback terminal 603. The voltage regulator 610 is connected to a connection terminal 701 of the voltage trimming circuit 700 at a first node N1 through a connection terminal 605.

The voltage trimming circuit 700 may adjust the level of the power supply voltage VDD in response to the reset signal RST and the first control signal CTL1 from the driver 500 through terminals 702. For example, the voltage trimming circuit 700 may receive the reset signal RST through a terminal 703, may receive a pulse signal PLS through a terminal 704, may receive an up/down signal UP/DN through a terminal 705, and may receive a fuse control signal FCTL through a terminal 706. The first control signal CTL1 may include the pulse signal PLS, the up/down signal UP/DN, and the fuse control signal FCTL.

Figure 7:
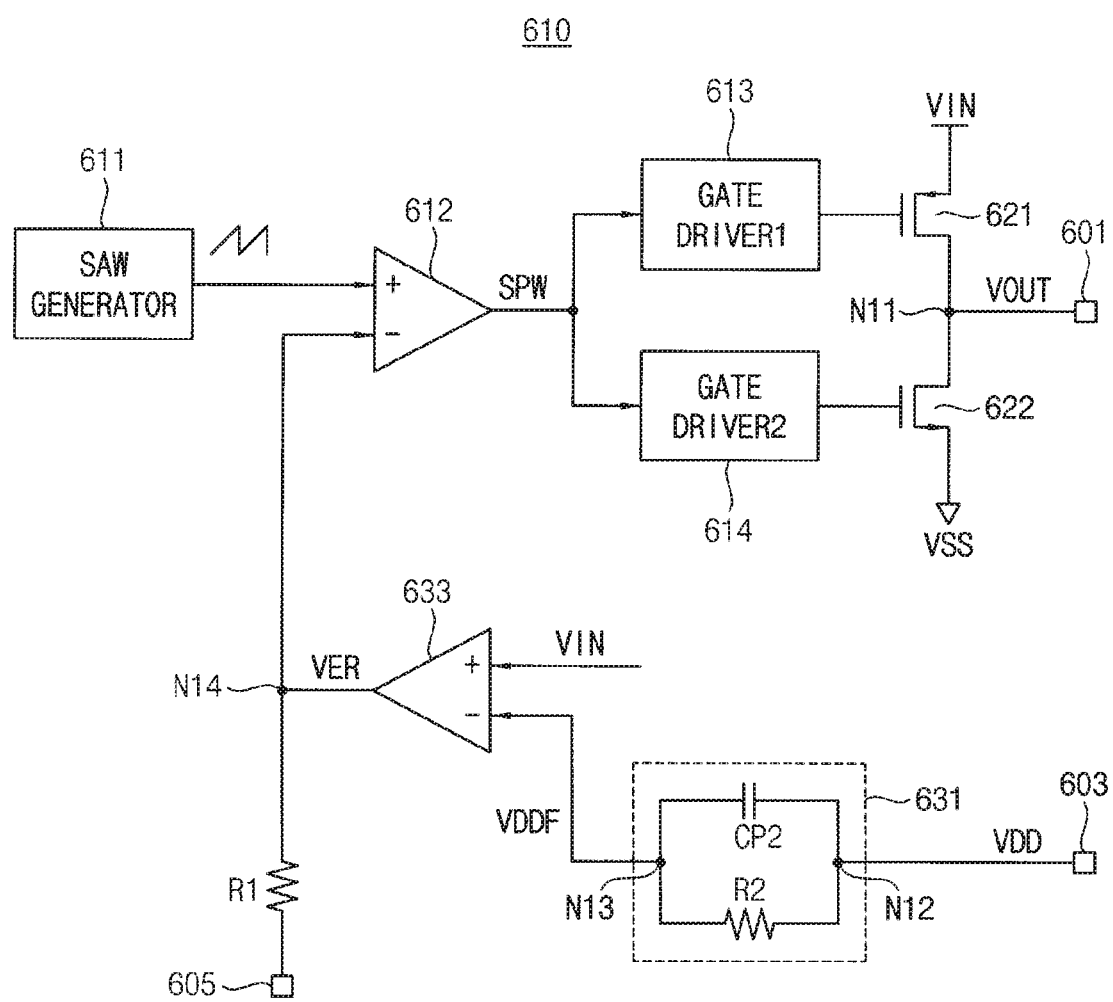
FIG. 7 is a circuit diagram illustrating a voltage regulator of FIG. 6 according to exemplary embodiments of the inventive concept.

FIG. 7 is a circuit diagram illustrating a voltage regulator of FIG. 6 according to exemplary embodiments of the inventive concept.

Referring to FIG. 7, the voltage regulator 610 may include a saw-tooth wave generator 611, a pulse-width modulation comparator 612, first and second gate drivers 613 and 614, a p-channel metal-oxide semiconductor (PMOS) transistor 621, an n-channel metal-oxide semiconductor (NMOS) transistor 622, a second low-pass filter 631, an error amplifier 633, and a first resistor R1.

The PMOS transistor 621 includes a source receiving the input voltage VIN, a gate connected to an output of the first gate driver 613, and a drain connected to a node N11. The NMOS transistor 622 includes a drain connected to the node N11, a gate connected an output of the second gate driver 614, and a source connected to the ground voltage VSS. The output voltage VOUT is provided through the output terminal 601 at the node N11.

The second low-pass filter 631 is connected between a node N12 and a node N13 and includes a capacitor CP2 and a second resistor R2 connected in parallel between the node N12 and the node N13. The power supply voltage VDD is provided to the second low-pass filter 631 through the feedback terminal 603. The second low-pass filter 631 filters high-frequency harmonic components of the power supply voltage VDD to provide a filtered voltage VDDF.

The error amplifier 633 amplifies a voltage difference between the input voltage VIN and the filtered voltage VDDF to output an error voltage VER. The error amplifier 633 has a positive input terminal to receive the input voltage VIN, a negative input terminal to receive the filtered voltage VDDF, and an output terminal to provide the error voltage VER. The error voltage VER is provided to a node N14. The error amplifier 633 compares the input voltage VIN and the filtered voltage VDDF and amplifies the voltage difference between the input voltage VIN and the filtered voltage VDDF. In other words, the error amplifier 633 detects the voltage difference between the input voltage VIN and the power supply voltage VDD.

The pulse-width modulation comparator 612 compares the error voltage VER and a saw-tooth wave from the saw-tooth wave generator 611 to output a pulse signal SPW having a pulse width corresponding to a voltage difference between the error voltage VER and the saw-tooth wave. The pulse-width modulation comparator 612 includes a negative input terminal to receive the error voltage VER, a positive input terminal to receive the saw-tooth wave, and an output terminal to provide the pulse signal SPW.

The first gate driver 613 drives the PMOS transistor 621 in response to the pulse signal SPW and the second gate driver 614 drives the NMOS transistor 622 in response to the pulse signal SPW. Thus, the first and second gate drivers 613 and 614 complementarily operate. The node N14 is connected to the connection terminal 605 through the first resistor R1.

Figure 8:
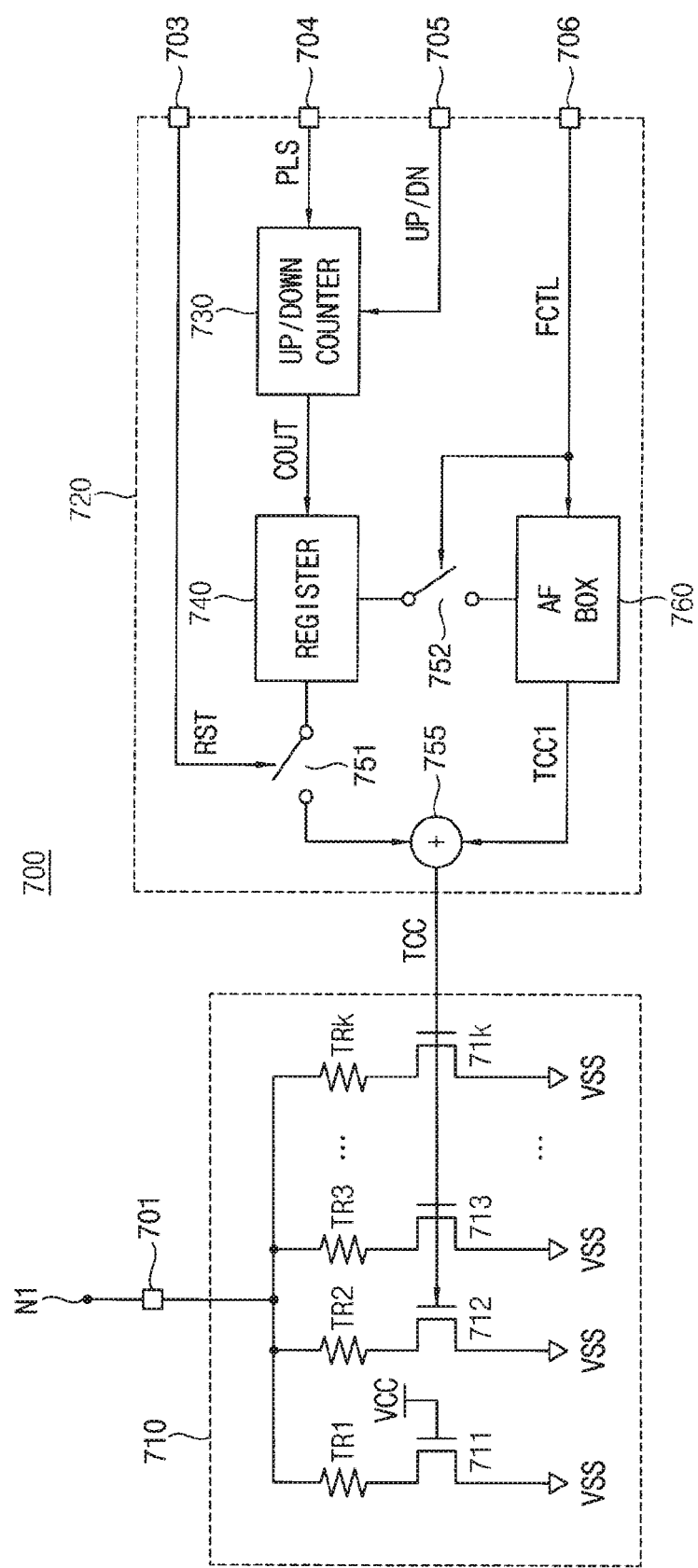
FIG. 8 is a circuit diagram illustrating a voltage trimming circuit in the PMIC of FIG. 6 according to exemplary embodiments of the inventive concept.

FIG. 8 is a circuit diagram illustrating a voltage trimming circuit in the PMIC of FIG. 6 according to exemplary embodiments of the inventive concept.

Referring to FIG. 8, the voltage trimming circuit 700 includes a trimming control circuit 720 and a trimming circuit 710.

The trimming control circuit 720 generates a trimming control code TCC while increasing or decreasing a value of the trimming control code TCC in response to the reset signal RST and the first control signal CTL1, and stores the trimming control code TCC to minimize a voltage difference between the input voltage VIN and the power supply voltage VDD. The trimming control circuit 720 may provide the trimming control code TCC to the trimming circuit 710.

The trimming circuit 710 is connected to the voltage regulator 610 at the first node N1 via the connection terminal 701 and may adjust the level of the power supply voltage VDD in response to the trimming control code TCC. The trimming circuit 710 may adjust the level of the power supply voltage VDD by adjusting a level of the error voltage VER.

The trimming control circuit 720 may include an up/down counter 730, a register 740, a first switch 751, a second switch 752, a nonvolatile storage 760, and an adder 755. The nonvolatile storage 760 may be implemented with a fuse box, an anti-fuse box, or an EEPROM.

The up/down counter 730 receives the pulse signal PLS through the terminal 704, and performs a counting operation based on the pulse signal PLS to output a counting output signal COUT. The up/down counter 730 may increase or decrease a value of the counting output signal COUT in response to the up/down signal UP/DN received through the terminal 705.

For example, the up/down counter 730 may change bits of the counting output signal COUT such that the value of the counting output signal COUT is increased or decreased. The up/down counter 730 performs an up-counting operation to increase the value of the counting output signal COUT, in response to an enabled up signal UP. The up/down counter 730 performs a down-counting operation to decrease the value of the counting output signal COUT, in response to an enabled down signal DN.

The register 740 is connected to the up/down counter 730 and stores the counting output signal COUT. The register 740 may be connected to the first switch 751 and the second switch 752.

The first switch 751 is connected between the register 740 and the adder 755, and selectively connects the register 740 to the adder 755 in response to the reset signal RST received through the terminal 703. Thus, the first switch 751 may selectively provide the adder 755 with the counting output signal COUT stored in the register 740 in response to the reset signal RST. The second switch 752 is connected between the register 740 and the nonvolatile storage 760 and may selectively provide the nonvolatile storage 760 with the counting output signal COUT stored in the register 740 in response to the fuse control signal FCTL received through the terminal 706.

When the reset signal RST designates the training mode, the first switch 751 connects the register 740 to the adder 755. When the reset signal RST designates the normal mode, the first switch 751 disconnects the register 740 from the adder 755.

When the fuse control signal FCTL is enabled, the second switch 752 connects the register 740 to the nonvolatile storage 760. The nonvolatile storage 760 may program the counting output signal COUT stored in the register 740 in a nonvolatile array therein in response to the enabled fuse control signal FCTL and a connection of the second switch 752.

In the training mode of the memory module 100, the adder 755 may provide the trimming circuit 710 with a sum of the counting output signal COUT stored in the register 740 and the counting output signal COUT programmed in the nonvolatile storage 760 as the trimming control signal TCC.

The trimming circuit 710 includes a plurality of trimming resistors TR1~TRk (where k is a natural number greater than two) and a plurality of NMOS transistors 711~71k. The trimming resistors TR1~TRk are connected in parallel with one another at the first node N1, and each of the NMOS transistors 711~71k is coupled between a corresponding one of the trimming resistors TR1~TRk and the ground voltage VSS. The NMOS transistor 711 of the NMOS transistors 711~71k has a gate coupled to a high-level voltage VCC and each gate of the other NMOS transistors 712~71k may receive a corresponding bit of the trimming control code TCC.

Referring to FIGS. 7 and 8, for example, when the up/down counter 730 performs the up-counting operation, a number of bits having high levels in the counting output signal COUT may be increased. Therefore, a number of turned-on NMOS transistors, among the NMOS transistors 712~71k, is increased, and a level of the error voltage VER at the first node N1 is decreased. When the level of the error voltage VER is decreased, a width of the pulse signal SPW is decreased and the first gate driver 613 may increase a turn-on timing of the PMOS transistor 621 to increase the level of the output voltage VOUT. When the level of the output voltage VOUT is increased, the level of the power supply voltage VDD is increased and the voltage difference between the input voltage VIN and the power supply voltage may be reduced.

For example, when the up/down counter 730 performs the down-counting operation, a number of bits having high levels in the counting output signal COUT may be decreased. Therefore, a number of turned-on NMOS transistors, among the NMOS transistors 712~71k, is decreased, and a level of the error voltage VER at the first node N1 is increased. When the level of the error voltage VER is increased, the width of the pulse signal SPW is increased and the second gate driver 614 may increase a turn-on timing of the NMOS transistor 622 to decrease the level of the output voltage VOUT. When the level of the output voltage VOUT is decreased, the level of the power supply voltage VDD is decreased and the voltage difference between the input voltage VIN and the power supply voltage may be reduced.

Therefore, the PMIC 600 may adjust the power supply voltage VIN in response to an inactivation and activation of the reset signal RST.

Figure 9:
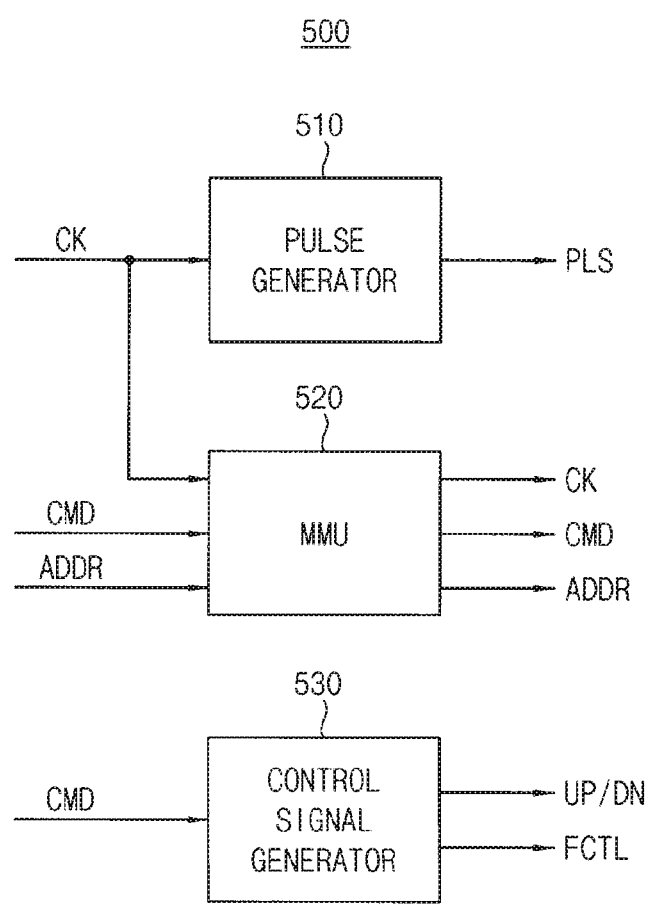
FIG. 9 is a block diagram illustrating a driver in FIG. 1 according to exemplary embodiments of the inventive concept.

FIG. 9 is a block diagram illustrating a driver in FIG. 1 according to exemplary embodiments of the inventive concept.

Referring to FIG. 9, the driver 500 may include a pulse generator 510, a memory management unit (MMU) 520, and a control signal generator 530.

The pulse generator 511 receives the clock signal CK and generates the pulse signal PLS based on the clock signal CK. The MMU 520 receives the clock signal CK, the command CMD, and the address ADDR, and repeats the clock signal CK, the command CMD, and the address ADDR to the memory devices 200. The control signal generator 530 receives the command CMD, decodes the command CMD, and generates the up/down signal UP/DN and the fuse control signal FCTL. The driver 500 may provide the PMIC 600 with the pulse signal PLS, the up/down signal UP/DN, and the fuse control signal FCTL, as the first control signal CTL1.

Figure 10:
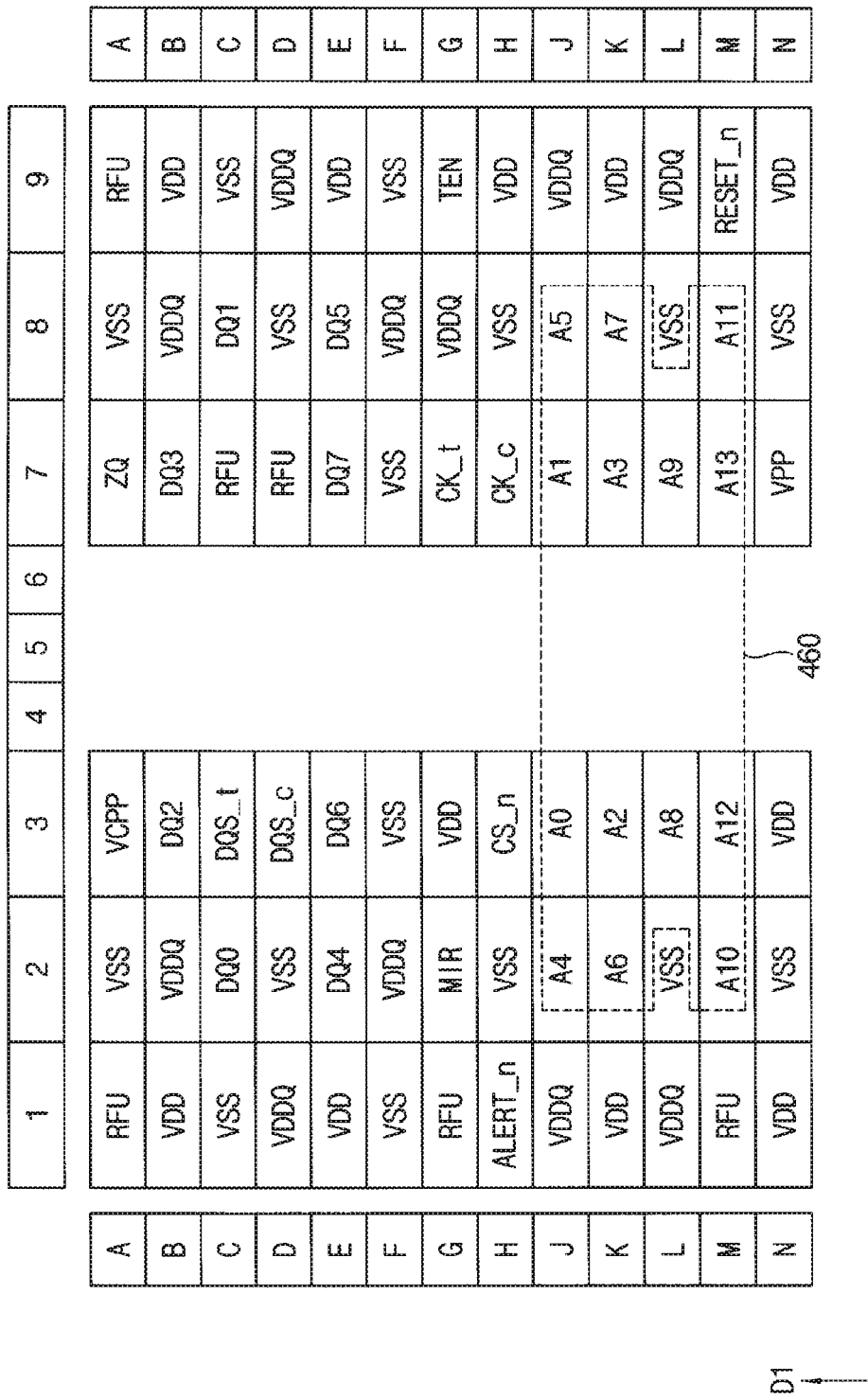
FIGS. 10 and 11 are diagrams illustrating a package ball assignment of each of the memory devices in FIG. 3A according to exemplary embodiments of the inventive concept.
Figure 11:
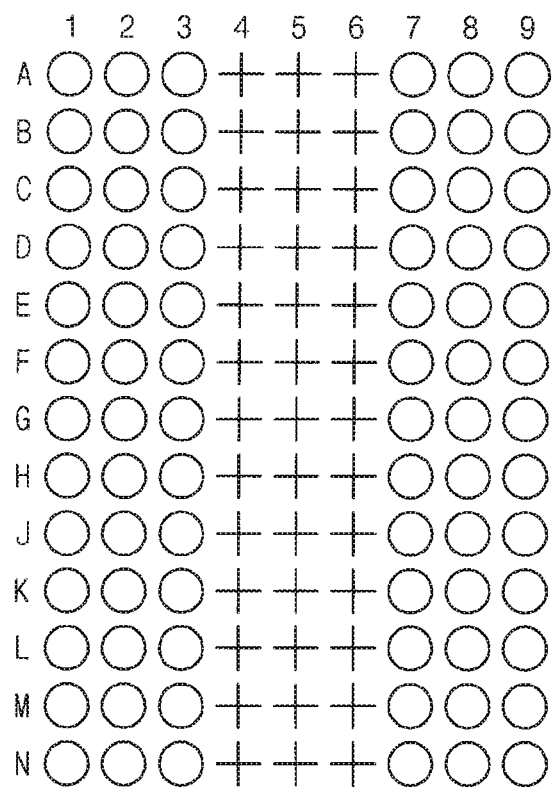
Figure 11:
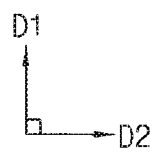

FIGS. 10 and 11 are diagrams illustrating a package ball assignment of each of the memory devices in FIG. 3A according to exemplary embodiments of the inventive concept.

Referring to FIGS. 10 and 11, each of the memory devices 201a~201e, 202a~202e, 203a~203e, and 204a~204e has balls that are arranged in thirteen rows A to N and six columns 1 to 3 and 7 to 9, e.g., two sets of three columns. Non-populated columns 4-6 are disposed between the two sets of columns. Balls are electrically populated with a power supply voltage, a ground voltage, a command, an address, a clock signal, control signals, and data input/output signals.

For example, a ball (MIR) positioned at the row G and the column 2 may correspond to mirroring function, a ball positioned at the row K and the column 3 may correspond to an address A2, and a ball positioned at the row K and the column 7 may correspond to an address A3. If the ball (MIR) positioned at the row G and the column 2 is connected to the power supply voltage, a corresponding memory device operates in the mirrored mode, and if the ball (MIR) positioned at the row G and the column 2 is connected to the ground voltage, a corresponding memory device operates in the standard mode.

Each of balls corresponding to even-numbered addresses A0, A2, A4, A6, A8, A10, and A12 of balls 460 corresponding to addresses A0~A13 may have symmetric (mirrored) assignment with each of balls corresponding to odd-numbered addresses A1, A3, A5, A7, A9, A11, and A13 of the balls 460 corresponding to addresses A0~A13. In other words, the SAMC 400 may swap each of the even-numbered addresses A0, A2, A4, A6, A8, A10, and A12 to a corresponding one of the odd-numbered addresses A1, A3, A5, A7, A9, A11, and A13 in the mirrored mode. In FIG. 10, 'RFU' denotes 'reserved for future use' and indicates an unassigned ball.

Figure 12:
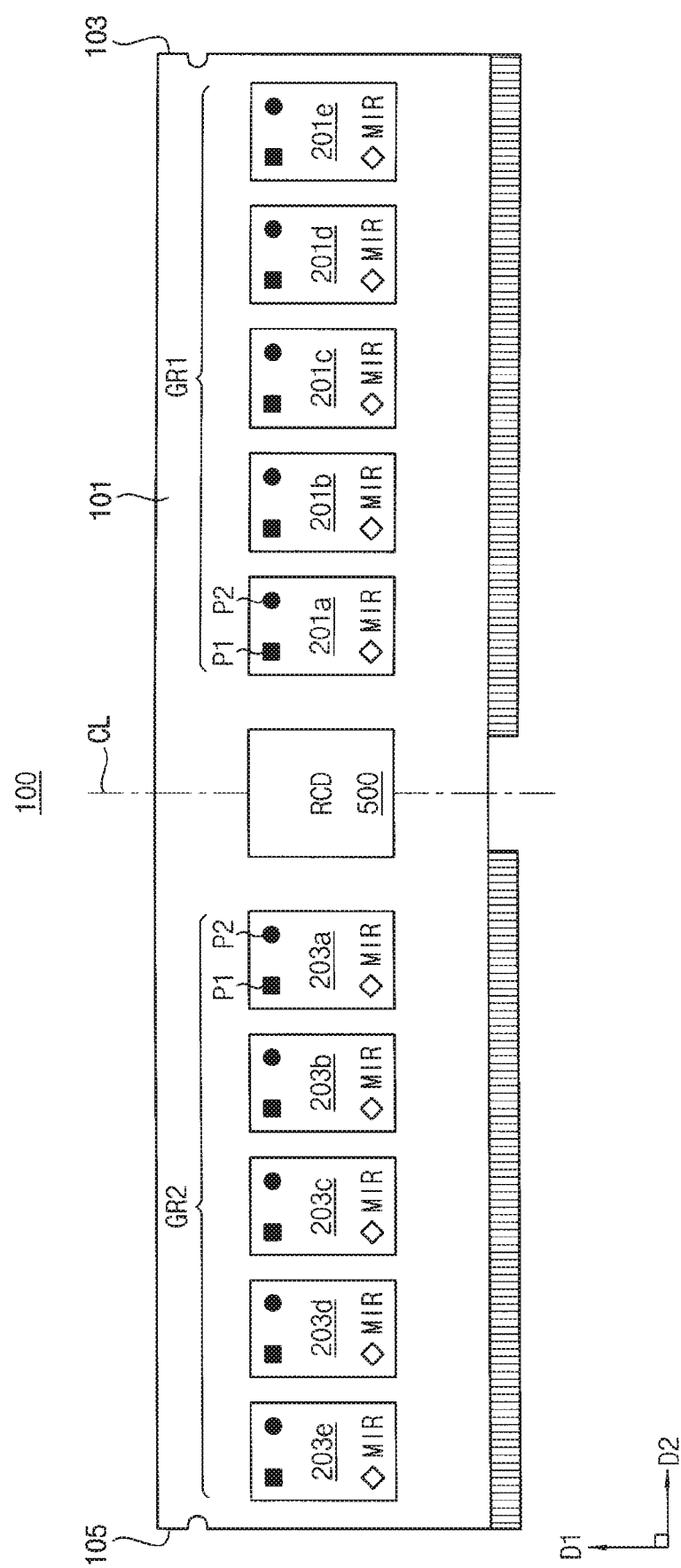
FIG. 12 illustrates the memory module of FIG. 3A according to exemplary embodiments of the inventive concept.

FIG. 12 illustrates the memory module of FIG. 3A according to exemplary embodiments of the inventive concept.

In FIG. 12, the memory devices 201a~201e disposed between the driver 500 and the first edge portion 103 are referred to as a first group GR1 of memory devices and the memory devices 203a~203e disposed between the driver 500 and the second edge portion 105 are referred to as a second group GR2 of memory devices. Each of the memory devices of the first group GR1 and the second GR2 has a mirror pin MIR and a pair of address pins P1 and P2 which are opposed to each other and have mirrored configuration. The memory devices 201a~201e and 203a~203e may have a plurality of pairs of address pins having mirrored configuration. A virtual center line CL disposed between the first group GR1 and the second group GR2 will be described in detail below.

Figure 13:
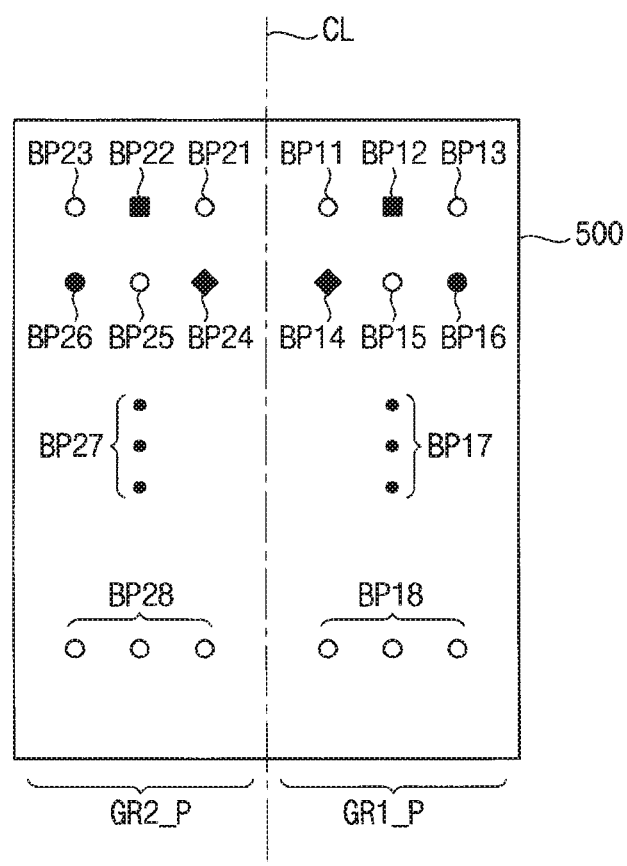
FIG. 13 illustrates a pin (ball) assignment of a driver in the memory module of FIG. 12 according to exemplary embodiments of the inventive concept.

FIG. 13 illustrates a pin (ball) assignment of a driver in the memory module of FIG. 12 according to exemplary embodiments of the inventive concept.

Referring to FIG. 13, the driver 500 may include a plurality of pins which are disposed symmetrically with respect to the virtual center line CL crossing the driver 500 in the first direction D1.

Pins BP11, BP12, and BP13 are disposed symmetrically with pins BP21, BP22, and BP23 with respect to the virtual center line CL, and the pair of pins BP11 and BP21 transmit the same address signal to the first group GR1 of the memory devices 201a~201e and the second group GR2 of the memory devices 203a~203e, respectively. Similar descriptions may be applied to pairs of pins BP12 and BP22, and BP13 and BP23. Pins BP14, BP15, and BP16 are disposed symmetrically with pins BP24, BP25, and BP26 with respect to the virtual center line CL, and each of the pairs of pins transmits the same signal to the first group GR1 of the memory devices 201a~201e and the second group GR2 of the memory devices 203a~203e, respectively.

Pins BP17 are disposed symmetrically with pins BP27 with respect to the virtual center line CL, and pins BP18 are disposed symmetrically with pins BP28 with respect to the virtual center line CL. The pins BP11~BP18 may be referred to as a first group of pins GR1_P because the pins BP11~BP18 transmit signals to the first group GR1 of the memory devices 201a~201e and the pins BP21~BP28 may be referred to as a second group of pins GR2_P because the pins BP21~BP28 transmit signals to the second group GR2 of the memory devices 203a~203e.

Figure 14:
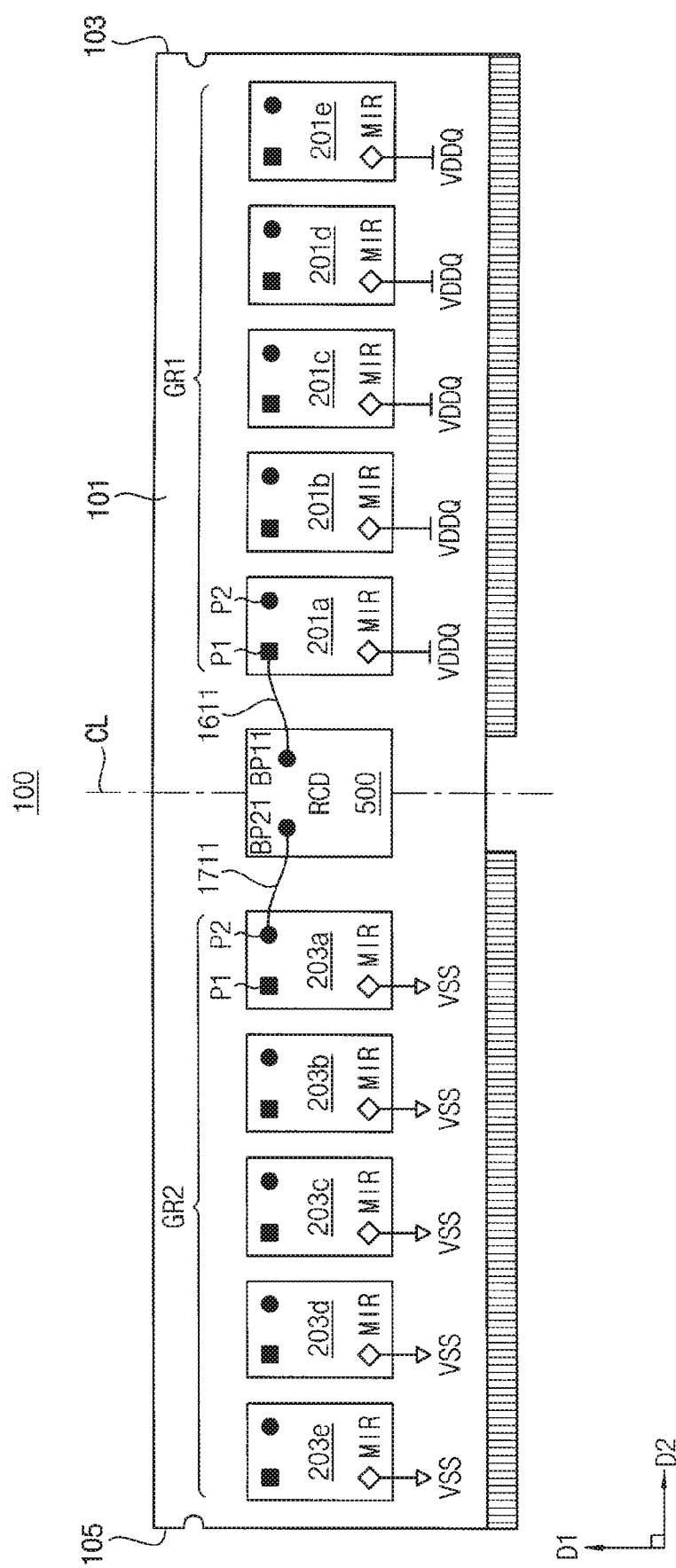
FIG. 14 illustrates a first group of memory devices operating in a mirrored mode in the memory module of FIG. 12 according to exemplary embodiments of the inventive concept.

FIG. 14 illustrates that a first group of memory devices operating in a mirrored mode in the memory module of FIG. 12 according to exemplary embodiments of the inventive concept.

Referring to FIG. 14, each mirror pin MIR of the first group GR1 of the memory devices 201a~201e is connected to a power supply voltage VDDQ and thus the first group GR1 of the memory devices 201a~201e operate in the mirrored mode, and each mirror pin MIR of the second group GR2 of the memory devices 203a~203e is connected to the ground voltage VSS and thus the second group GR2 of the memory devices 203a~203e operate in the standard mode. The first group GR1 of the memory devices 201a~201e may be referred to as a selected group of the memory devices and the second group GR2 of the memory devices 203a~203e may be referred to an unselected group of memory devices.

The driver 500 applies a first address bit to the address pin P1 of each of the first group GR1 of the memory devices 201a~201e through a command/address transmission line 1611 and applies the first address bit to the address pin P2 of each of the second group GR2 of the memory devices 203a~203e through a command/address transmission line 1711. Since each of the first group GR1 of the memory devices 201a~201e operates in the mirrored mode, each of the first group GR1 of the memory devices 201a~201e changes the first address bit applied to the address pin P1 to a corresponding mirrored address bit and provides the mirrored address bit to inside of each of the first group GR1 of the memory devices 201a~201e.

Since each of the second group GR2 of the memory devices 203a~203e operates in the standard mode, each of the second group GR2 of the memory devices 203a~203e maintains the address bit applied to the address pin P2 and provides the maintained address bit to inside of each of the second group GR2 of the memory devices 203a~203e.

In FIG. 14, the command/address transmission lines 1611 and 1711 are routed symmetrically with respect to the virtual center line CL. In other words, the driver 500 may transmit the address signal to the first group GR1 of the memory devices 201a~201e and the second group GR2 of the memory devices 203a~203e through a first transmission line (e.g., the command/address transmission line 1611) and a second transmission line (e.g., the command/address transmission line 1711), respectively, which are physically symmetric with respect to the virtual center line CL.

Figure 15:
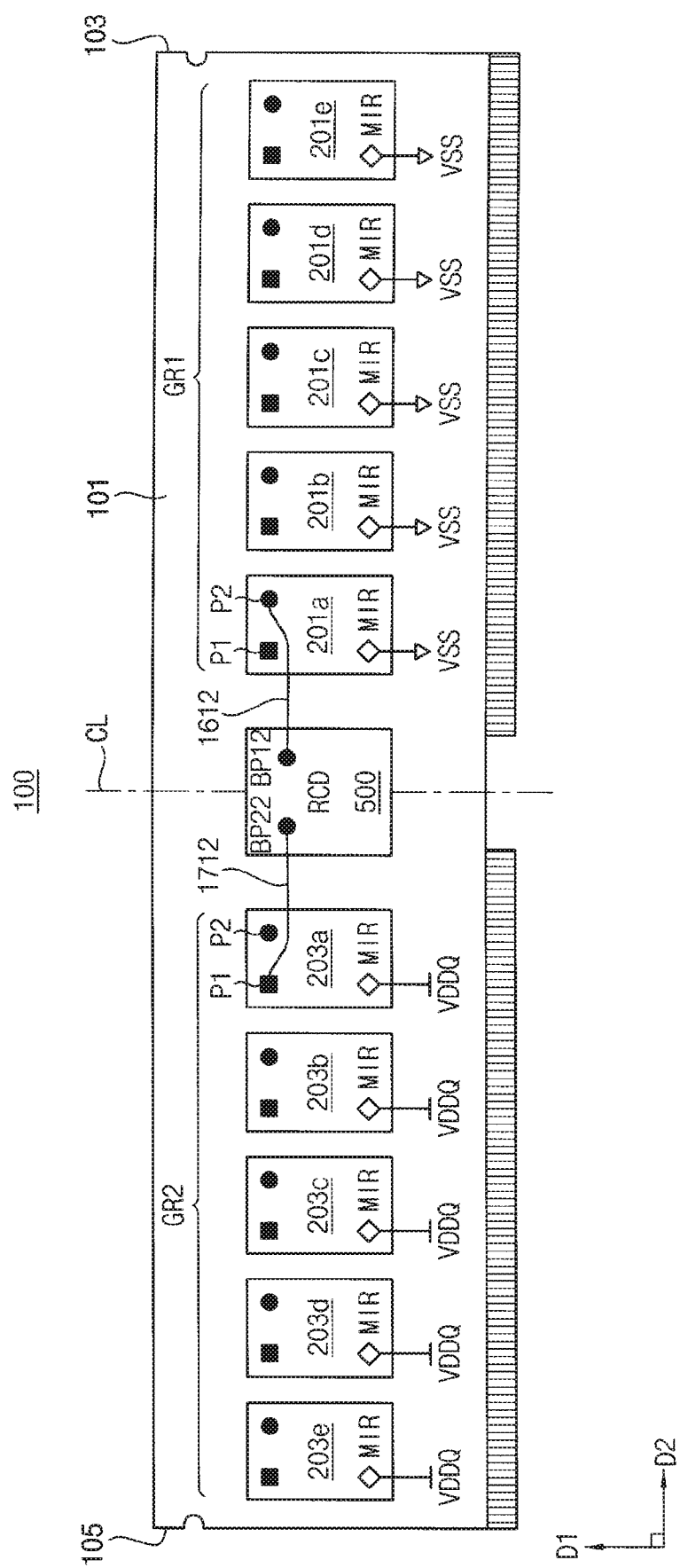
FIG. 15 illustrates a second group of memory devices operating in the mirrored mode in the memory module of FIG. 12 according to exemplary embodiments of the inventive concept.

FIG. 15 illustrates a second group of memory devices operating in the mirrored mode in the memory module of FIG. 12 according to exemplary embodiments of the inventive concept.

Referring to FIG. 15, each mirror pin MIR of the first group GR1 of the memory devices 201a~201e is connected to the ground voltage VSS and thus the first group GR1 of the memory devices 201a~201e operate in the standard mode, and each mirror pin MIR of the second group GR2 of the memory devices 203a~203e is connected to the power supply voltage VDDQ and thus the second group GR2 of the memory devices 203a~203e operate in the mirrored mode. The driver 500 applies a second address bit to the address pin P2 of each of the first group GR1 of the memory devices 201a~201e through a command/address transmission line 1612 and applies the second address bit to the address pin P1 of each of the second group GR2 of the memory devices 203a~203e through a command/address transmission line 1712. Since each of the second group GR2 of the memory devices 203a~203e operates in the mirrored mode, each of the second group GR2 of the memory devices 203a~203e changes the second address bit applied to the address pin P1 to a corresponding mirrored address bit and provides the mirrored address bit to inside of each of the second group GR2 of the memory devices 203a~203e.

Since each of the first group GR1 of the memory devices 201a~201e operates in the standard mode, each of the first group GR1 of the memory devices 201a~201e maintains the address bit applied to the address pin P2 and provides the maintained address bit to inside of each of the first group GR1 of the memory devices 201a~201e.

In FIG. 15, the command/address transmission lines 1612 and 1712 are routed symmetrically with respect to the virtual center line CL.

Figure 16:
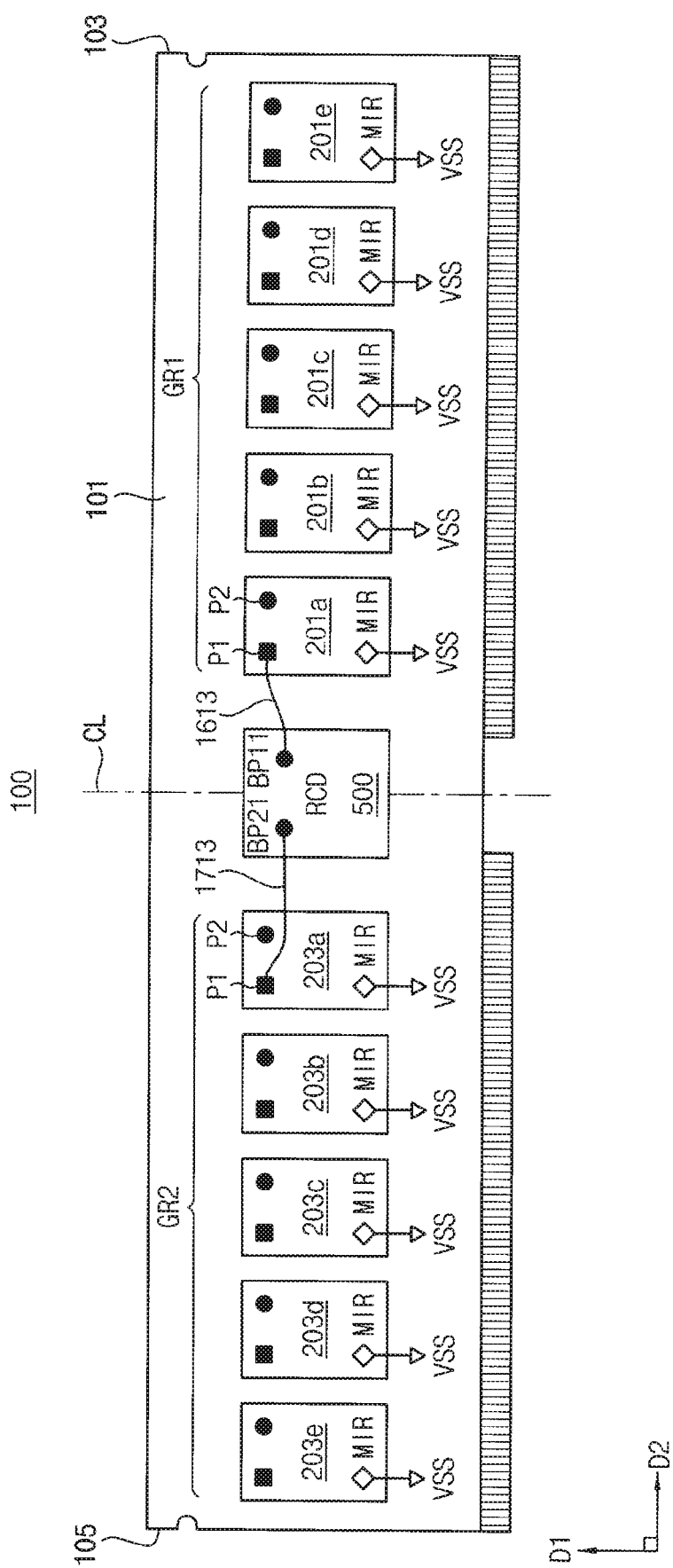
FIG. 16 illustrates the first group of memory devices and the second group of memory devices operating in a standard mode in the memory module of FIG. 12 according to exemplary embodiments of the inventive concept.

FIG. 16 illustrates the first group of memory devices and the second group of memory devices operating in a standard mode in the memory module of FIG. 12 according to exemplary embodiments of the inventive concept.

Referring to FIG. 16, each mirror pin MIR of the first group GR1 of the memory devices 201a~201e is connected to the ground voltage VSS and thus the first group GR1 of the memory devices 201a~201e operate in the standard mode, and each mirror pin MIR of the second group GR2 of the memory devices 203a~203e is connected to the ground voltage VSS and thus the second group GR2 of the memory devices 203a~203e also operate in the standard mode.

The driver 500 applies a second address bit to the address pin P1 of each of the first group GR1 of the memory devices 201a~201e through a command/address transmission line 1613 and applies the first address bit to the address pin P1 of each of the second group GR2 of the memory devices 203a~203e through a command/address transmission line 1713. Each of the first group GR1 of the memory devices 201a~201e operates in the standard mode and each of the second group GR2 of the memory devices 203a~203e operates in the standard mode. Therefore, the command/address transmission lines 1613 and 1713 are routed unsymmetrically with respect to the virtual center line CL.

Figure 17:
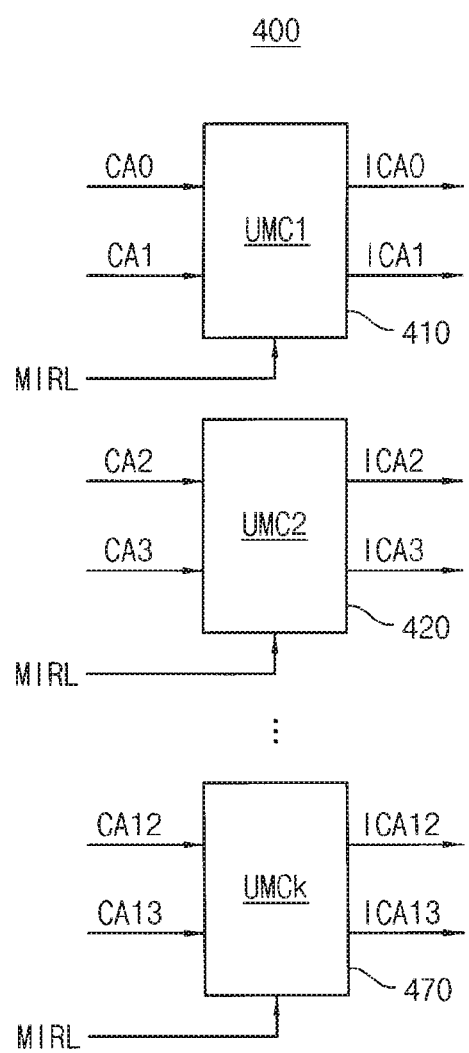
FIG. 17 is a block diagram illustrating a selective address mirroring circuit (SAMC) in the memory device of FIG. 4 according to exemplary embodiments of the inventive concept.

FIG. 17 is a block diagram illustrating a selective address mirroring circuit (SAMC) in the memory device of FIG. 4 according to exemplary embodiments of the inventive concept.

Referring to FIG. 17, the SAMC 400 may include a plurality of unit address mirroring circuits (UMC1, UMC2, and UMCk) 410, 420, and 470.

The UMC1 410 receives address bits CA0 and CA1 constituting a mirroring pair, swaps or maintains the address bits CA0 and CA1 based on the voltage level MIRL of the mirror pin, and outputs internal address bits ICA0 and ICA1. The UMC1 410 outputs the internal address bits ICA0 and ICA1 by swapping the address bits CA0 and CA1 in the mirrored mode or maintaining the address bits CA0 and CA1 in the standard mode.

The UMC2 420 receives address bits CA2 and CA3 constituting a mirroring pair, swaps or maintains the address bits CA2 and CA3 based on the voltage level MIRL of the mirror pin, and outputs internal address bits ICA2 and ICA3. The UMCk 470 receives address bits CA12 and CA13 constituting a mirroring pair, swaps or maintains the address bits CA12 and CA13 based on the voltage level MIRL of the mirror pin, and outputs internal address bits ICA12 and ICA13.

Figure 18:
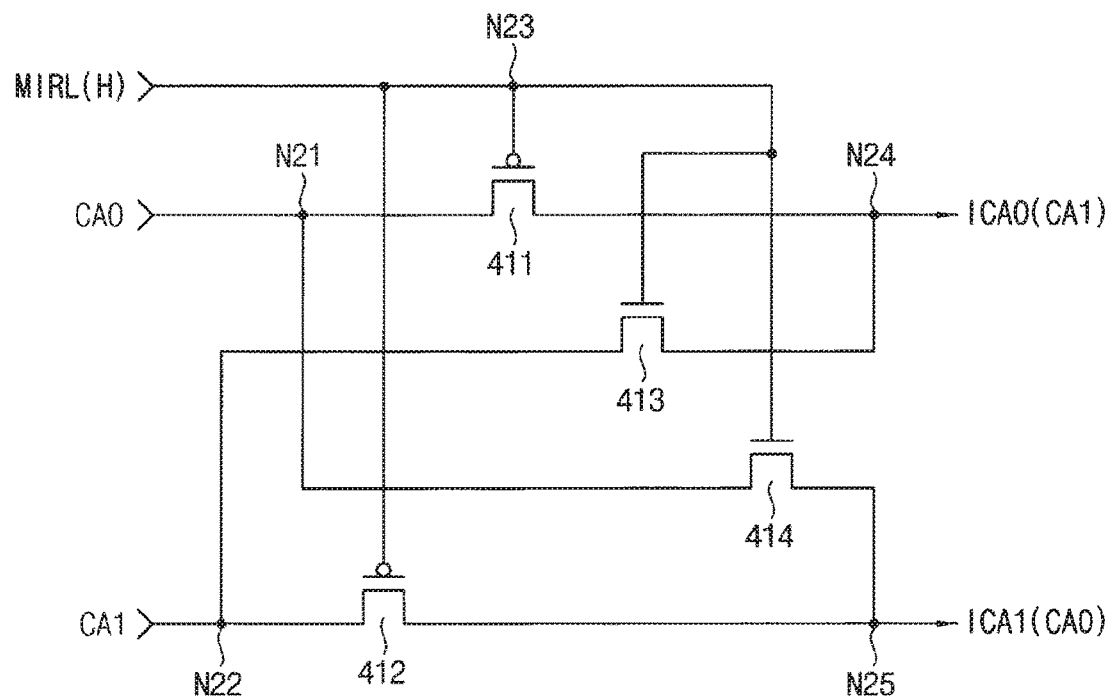
FIG. 18 illustrates an operation of a first unit address mirroring circuit (UMC1) in the SAMC in FIG. 17 when a voltage level of mirror pins is a high level according to exemplary embodiments of the inventive concept.

FIG. 18 illustrates an operation of a first unit address mirroring circuit (UMC1) in the SAMC in FIG. 17 when a voltage level of mirror pins is a high level according to exemplary embodiments of the inventive concept.

Each configuration of the UMC2 and UMCk 420 and 470 may be substantially the same as a configuration of the UMC1 410. In FIG. 18, it is assumed that the voltage level MIRL of the mirror pins is a high level.

Referring to FIG. 18, the UMC1 410 includes PMOS transistors 411 and 412 and NMOS transistors 413 and 414.

The PMOS transistor 411 has a first electrode which is connected to a first node N21 and receives the address bit CA0, a gate which is connected to a third node N23 and receives the voltage level MIRL of the mirror pin, and a second electrode which is connected to a fourth node N24 and provides the internal address bit ICA0. The PMOS transistor 412 has a first electrode which is connected to a second node N22 and receives the address bit CA1, a gate which is connected to the third node N23 and receives the voltage level MIRL of the mirror pin, and a second electrode which is connected to a fifth node N25 and provides the internal address bit ICA1.

The NMOS transistor 413 has a first electrode which is connected to the second node N21 and receives the address bit CA1, a gate which is connected to the third node N23 and receives the voltage level MIRL of the mirror pin, and a second electrode which is connected to the fourth node N24. The NMOS transistor 414 has a first electrode which is connected to the first node N21 and receives the address bit CA0, a gate which is connected to the third node N23 and receives the voltage level MIRL of the mirror pin, and a second electrode which is connected to the fifth node N25.

If the voltage level MIRL of the mirror pin is a high level 'H', the PMOS transistors 411 and 412 are turned-off and the NMOS transistors 413 and 414 are turned-on. Therefore, the UMC1 410 swaps address bits CA0 and CA1 constituting a mirroring pair, outputs the address bit CA1 as the internal address bit ICA0, and outputs address bit CA0 as the internal address bit ICA1. The voltage level MIRL of the mirror pin denotes a voltage level of the mirror pin.

Figure 19:
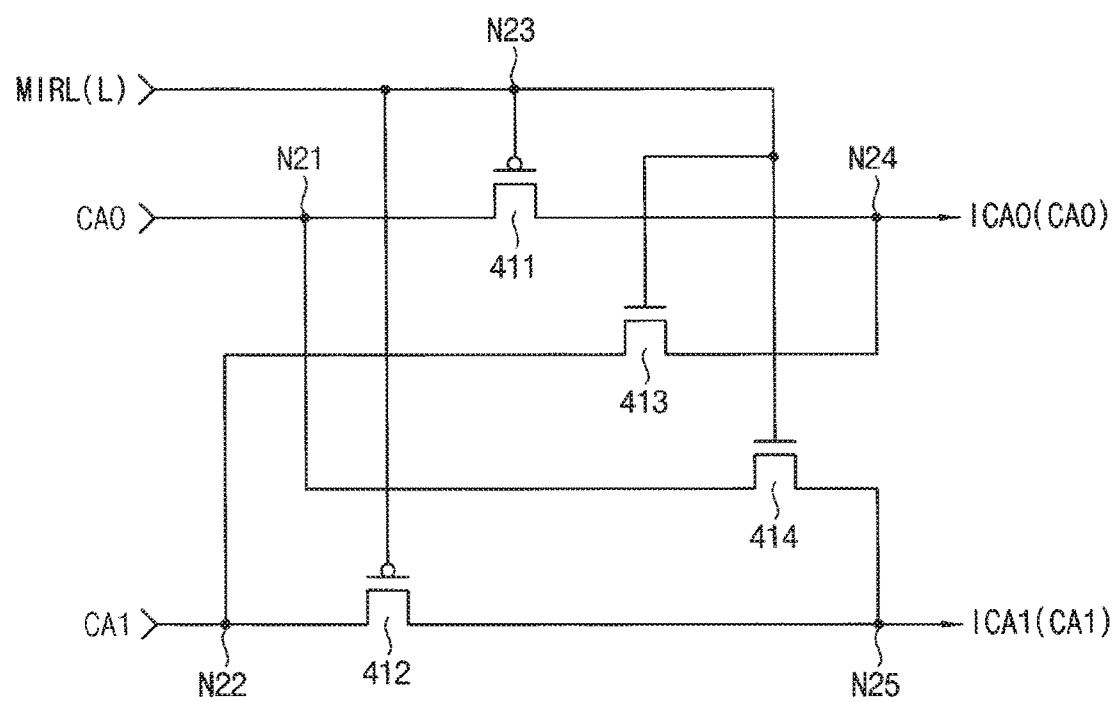
FIG. 19 illustrates an operation of the UMC1 when the voltage level of the mirror pins is a low level according to exemplary embodiments of the inventive concept.

FIG. 19 illustrates an operation of the UMC1 when the voltage level of the mirror pins is a low level according to exemplary embodiments of the inventive concept.

Referring to FIG. 19, if the voltage level MIRL of the mirror pin is a low level 'L', the PMOS transistors 411 and 412 are turned-on and the NMOS transistors 413 and 414 are turned-off. Therefore, the UMC1 410 maintains address bits CA0 and CA1 constituting a mirroring pair, outputs the address bit CA0 as the internal address bit ICA0, and outputs address bit CA1 as the internal address bit ICA1.

Figure 20:
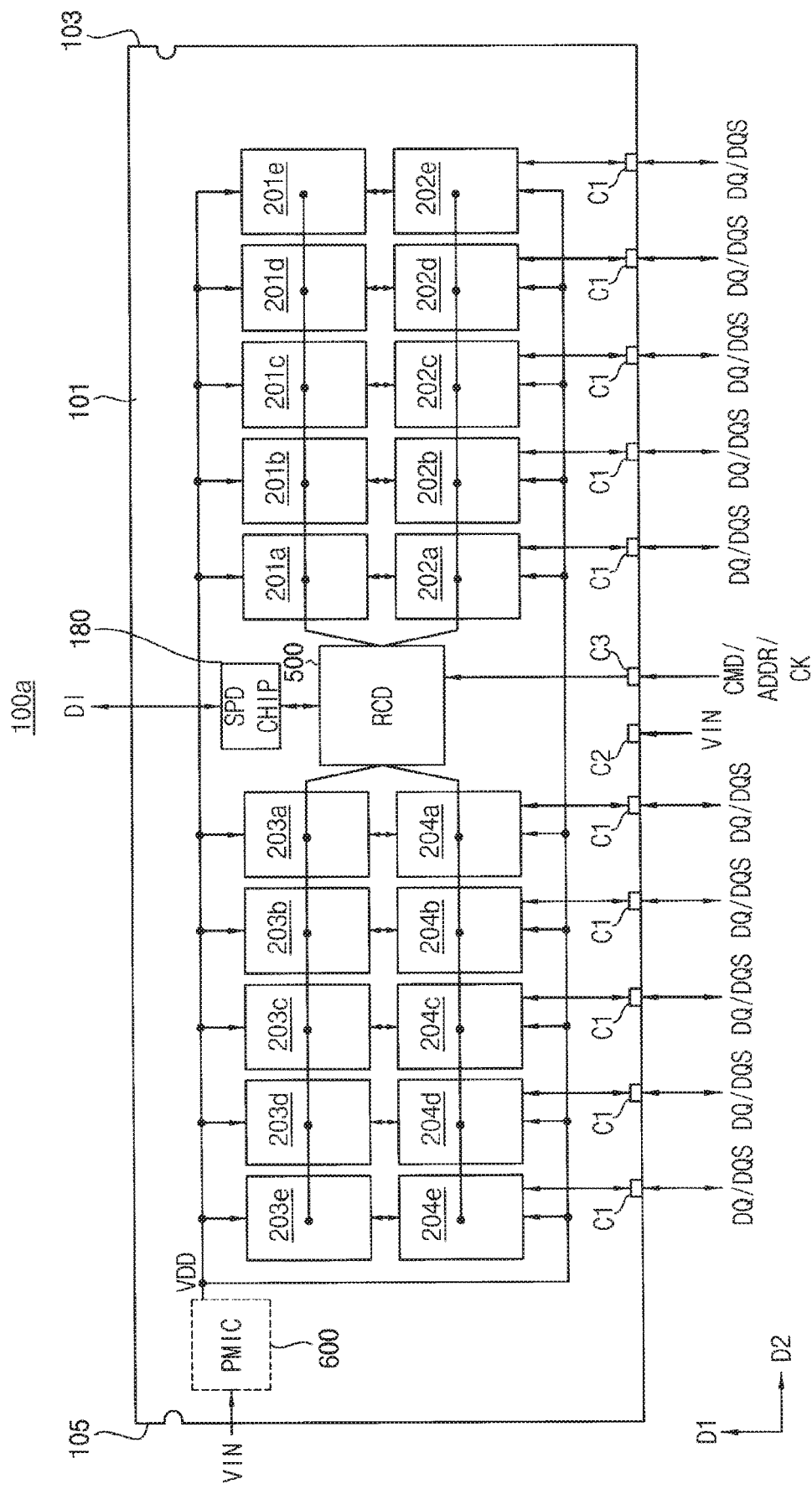
FIG. 20 is a block diagram illustrating a memory module of FIG. 1 according to exemplary embodiments of the inventive concept.

FIG. 20 is a block diagram illustrating a memory module of FIG. 1 according to exemplary embodiments of the inventive concept.

A memory module 100a of FIG. 20 differs from the memory module 100 of FIG. 3A in that the memory module 100a of FIG. 20 does not include data buffers which receive/transmit the data signal DQ and the data strobe signal DQS from/to the plurality of memory devices 201a~201e, 202a~202e, 203a~203e, and 204a~204e. The memory module 100a may exchange the data signal DQ and the data strobe signal DQS with the memory controller 25 through the first connectors C1, may receive the input voltage VIN through the second connector C2, and may receive various signals including the command CMD, the address signal ADDR, and the clock signal CK through the third connector C3.

Figure 21:
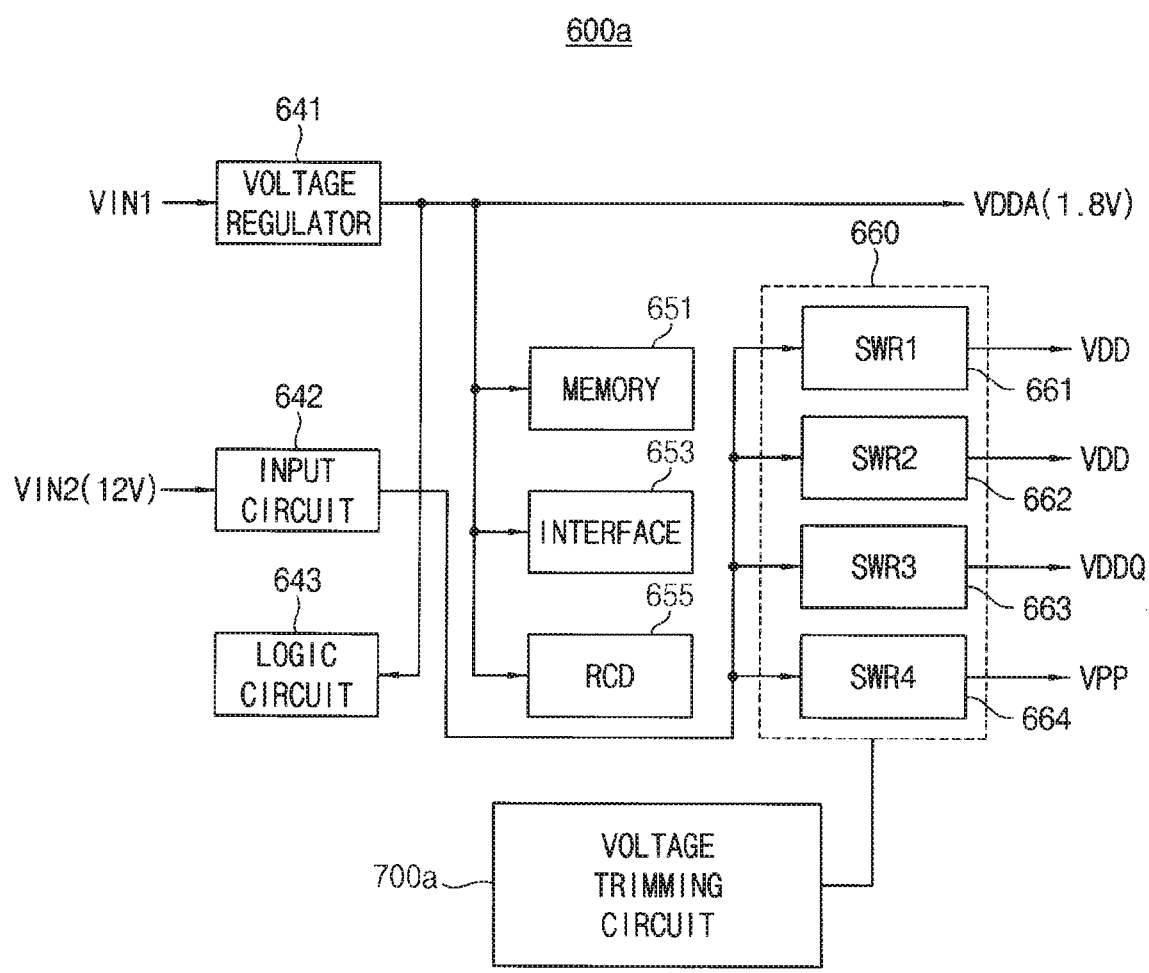
FIG. 21 is a block diagram illustrating a PMIC according to exemplary embodiments of the inventive concept.

FIG. 21 is a block diagram illustrating a PMIC according to exemplary embodiments of the inventive concept.

Referring to FIG. 21, a PMIC 600a includes a voltage regulator 641, an input circuit 642, a logic circuit 643, a memory 651, an interface 653, a driver 655, a switching regulator unit 660, and a voltage trimming circuit 700a. The switching regulator unit 660 may include first through fourth switching regulators 661~664.

The voltage regulator 641 may be implemented with a low drop-out (LDO) regulator, may receive a first input voltage VIN1 corresponding to a bulk voltage, and may generate a power supply voltage VDDA. The voltage regulator 641 may provide the power supply voltage VDDA to the logic circuit 643, the memory 651, the interface 653, and the driver 655, and may provide the power supply voltage VDDA to the memory devices 200. The power supply voltage VDDA may be about 1.8V.

The input circuit 642 receives a second input voltage VIN2 and provides the second input voltage VIN2 to the first through fourth switching regulators 661~664. Each of the first and second switching regulators 661 and 662 generates the power supply voltage VDD based on the second input voltage VIN2, the third switching regulator 563 generates a power supply voltage VDDQ based on the second input voltage VIN2, and the fourth switching regulator 664 generates a high power supply voltage VPP based on the second input voltage VIN2. The second input voltage VIN2 may be about 12 V.

The logic circuit 643 may include an analog-to-digital converter, an oscillator, or the like. The memory 651 may store operation data for the PMIC 600a, and the interface 653 may perform interfacing with the driver 500 on the circuit board 101 and with an external device. The driver 655 may communicate with the driver 500 through the interface 653.

The voltage trimming circuit 700a may be similar to the voltage trimming circuit 700 of FIG. 8 and may adjust voltage levels of some or all of the first through fourth switching regulators 661~664.

Figure 22:
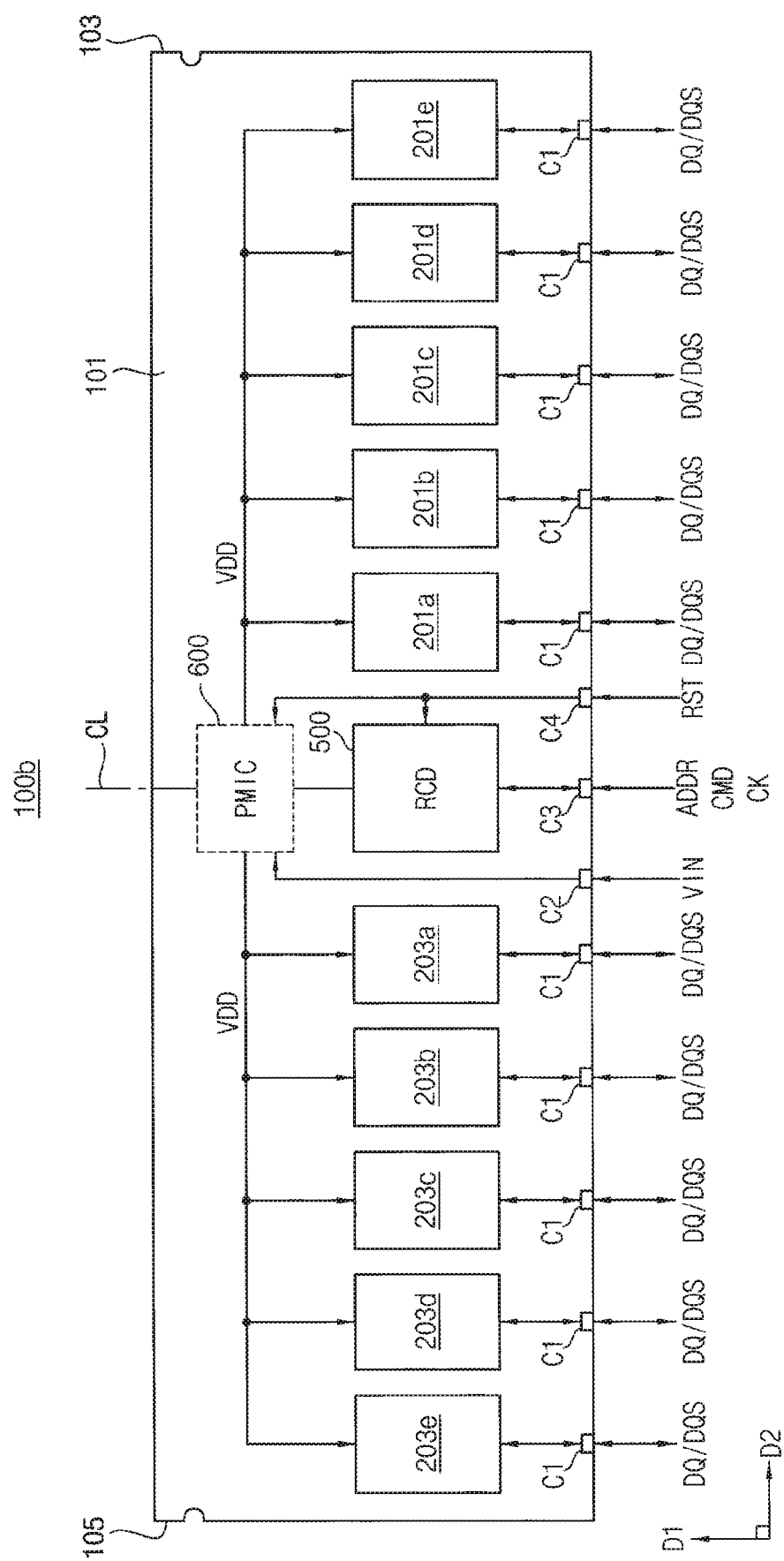
FIG. 22 is a block diagram illustrating the memory module of FIG. 1 according to exemplary embodiments of the inventive concept.

FIG. 22 is a block diagram illustrating the memory module of FIG. 1 according to exemplary embodiments of the inventive concept.

A memory module 100b of FIG. 22 differs from the memory module 100 of FIG. 2 in that the memory module 100b does not include data buffers which receive/transmit the data signal DQ and the data strobe signal DQS from/to the plurality of memory devices 201a~201e, 202a~202e, 203a~203e, and 204a~204e and in that the memory module 100b receives the reset signal RST from a fourth connector C4.

The memory module 100b may exchange the data signal DQ and the data strobe signal DQS with the memory controller 25 through the first connectors C1, may receive the input voltage VIN through the second connector C2, may receive various signals including the command CMD, the address signal ADDR, and the clock signal CK through the third connector C3, and may receive the reset signal RST through the fourth connector C4. The reset signal RST may be provided to the driver 500 and the PMIC 600. The driver 500 transfers the reset signal RST to the memory devices 201a~201e, 202a~202e, 203a~203e, and 204a~204e.

Figure 23:
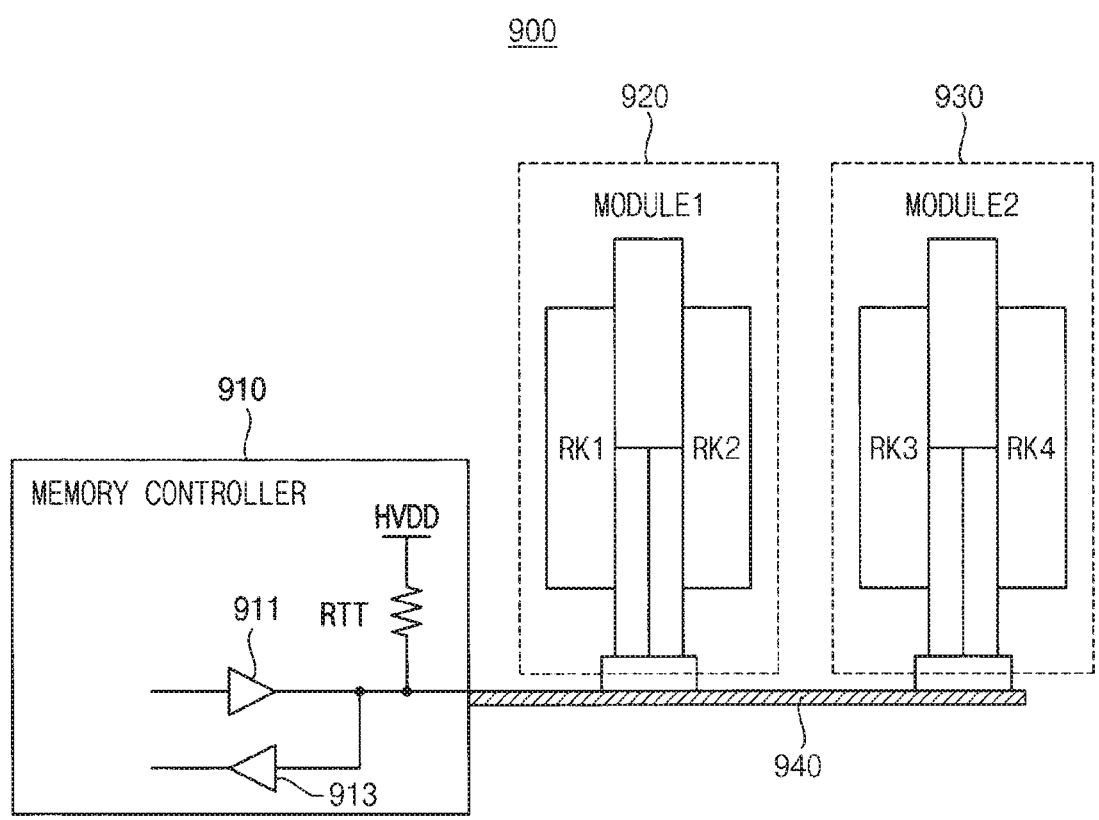
FIG. 23 is a block diagram illustrating a memory system having quad-rank memory modules according to exemplary embodiments of the inventive concept.

FIG. 23 is a block diagram illustrating a memory system having quad-rank memory modules according to exemplary embodiments of the inventive concept.

Referring to FIG. 23, a memory system 900 may include a memory controller 910 and at least one or more memory modules (e.g., a first memory module 920 and a second memory module 930).

The memory controller 910 may control a memory module so as to perform a command supplied from the processor or host. The memory controller 910 may be implemented in a processor or host, or may be implemented with an application processor or a system-on-a-chip (SoC). The memory controller 910 includes a transmitter 911 and a receiver 913. For signal integrity, a source termination may be implemented with a resistor RTT coupled to a host voltage HVDD on a bus 940 of the memory controller 910.

The first memory module 920 and the second memory module 930 may be coupled to the memory controller 910 through the bus 940. Each of the first memory module 920 and the second memory modules 930 may correspond to the memory module 100 of FIG. 3A, the memory module 100a of FIG. 20, or the memory module 100b of FIG. 22. The first memory module 920 may include at least one or more memory ranks RK1 and RK2, and the second memory module 930 may include at least one or more memory ranks RK3 and RK4. Each of the first memory module 920 and the second memory module 930 may include a PMIC such as the PMIC 600 of FIG. 6, may provide a power supply voltage (e.g., VDD) to the one or more memory ranks, and may adjust the input voltage (e.g., VIN) such that a voltage difference between the input voltage and the power supply voltage is reduced, in response to a signal from an outside.

Exemplary embodiments of the inventive concept as described above may be applied to systems using memory modules.

Accordingly, the memory module according to exemplary embodiments of the inventive concept includes the PMIC that adjusts the power supply voltage to follow the input voltage and provides the adjusted power supply voltage to the memory devices. Therefore, the memory module may have reduced power consumption and enhanced performance.

While the inventive concept has been shown and described above with reference to exemplary embodiments thereof, it will be apparent to those of ordinary skill in the art that modifications and variations in form and details may be made thereto without departing from the spirit and scope of the inventive concept, as set forth by the following claims.

What is claimed is:

1. A memory module comprising:
a circuit board including first connectors, a second connector, and a third connector connected to an external device;
a plurality of memory devices mounted on a first surface of the circuit board, and connected to the first connectors;
a power management integrated circuit (PMIC) mounted on a second surface of the circuit board, wherein the PMIC is configured to receive a first voltage through the second connector, configured to generate a second voltage using the first voltage, and configured to provide the second voltage to the plurality of memory devices, and
a driver mounted on the first surface of the circuit board, wherein the PMIC is further configured to adjust the second voltage based on a signal received through the third connector such that a voltage difference of the first voltage and the second voltage is reduced in a training mode of the memory module and
wherein the first surface is opposed to the second surface.

2. The memory module of claim 1, wherein the PMIC is further configured to receive the signal directly from the third connector, configured to detect the voltage difference, and configured to adjust the second voltage based on the detected voltage difference in the training mode.

3. The memory module of claim 2, wherein the signal includes a reset signal, and
wherein the memory module further includes a driver mounted on the circuit board, and the driver is configured to receive the reset signal and transfer the reset signal to the plurality of memory devices.

4. The memory module of claim 3, further comprising a plurality of data buffers connected between the first connectors and the plurality of memory devices.

5. The memory module of claim 3, wherein the PMIC is further configured to adjust the second voltage in response to an inactivation and activation of the reset signal.

6. The memory module of claim 1, wherein the PMIC is further configured to:
store a trimming control code to minimize the voltage difference between the first voltage and the second voltage in the training mode; and
generate the second voltage using the trimming control code and provide the second voltage to the plurality of memory devices in a normal mode of the memory module.

7. The memory module of claim 1, wherein each of the plurality of memory devices is a double data rate 5 (DDR5) synchronous dynamic random access memory (SDRAM).

8. The memory module of claim 1, wherein the driver is configured to control the plurality of memory devices and the PMIC based on a command and an address signal received through the third connector.

9. The memory module of claim 8, wherein
the plurality of memory devices includes a first group of memory devices disposed between the driver and a first edge portion of the first surface and a second group of memory devices disposed between the driver and a second edge portion of the first surface.

10. The memory module of claim 9, wherein:
the driver is configured to transmit the address signal to the first group of memory devices and the second group of memory devices through a first transmission line and a second transmission line, respectively, wherein the first transmission line and the second transmission line are symmetric with respect to the driver,
the first edge portion and the second edge portion extend in a first direction,
the first group of memory devices is disposed in a second direction crossing the first direction between the driver and the first edge portion,
the second group of memory devices is disposed in the second direction between the driver and the second edge portion, and
each of the first group of memory devices and each of the second group of memory devices have the same pin configuration along the first direction and the second direction.

11. The memory module of claim 10, wherein:
a selected group of memory devices of the first group of memory devices and the second group of memory devices receive the address signal in a mirrored mode, and
an unselected group of memory devices of the first group of memory devices and the second group of memory devices receive the address signal in a standard mode.

12. The memory module of claim 10, wherein:
each mirror pin of a selected group of memory devices of the first group of memory devices and the second group of memory devices is connected to a power supply voltage, and
each of the selected group of memory devices receives the address signal in a mirrored mode, and
each mirror pin of an unselected group of memory devices of the first group of memory devices and the second group of memory devices is connected to a ground voltage, and each of the unselected group of memory devices receives the address signal in a standard mode.

13. The memory module of claim 12, wherein each of the selected group of memory devices is configured to swap at least some of bits of the address signal in the mirrored mode.

14. The memory module of claim 12, wherein each of the selected group of memory devices is configured to swap even numbered column address of the address signal with a next higher odd numbered column address of the address signal in the mirrored mode.

15. The memory module of claim 10, wherein:
the driver includes a plurality of pins;
the plurality of pins are disposed symmetrically with respect to a virtual center line crossing the driver in the first direction; and
the driver is configured to transmit the same bit of the address signal to the first group of memory devices and the second group of memory devices through a first address pin and a second address pin of the plurality of pins, wherein the first address pin and the second address pin are opposed to each other.

16. The memory module of claim 14, wherein:
each of the first group of memory devices and the second group of memory devices includes a selective address mirroring circuit,
the selective address mirroring circuit is connected to a mirror pin and is configured to selectively change the address signal to a corresponding mirrored address signal based on a voltage level of the mirror pin, and
the selective address mirroring circuit is further configured to operate in a mirrored mode to change some bits of the address signal to corresponding mirrored address bits if the mirror pin is connected to a power supply voltage, and to operate in a standard mode to maintain bits of the address signal if the mirror pin is connected to a ground voltage.

17. A memory module comprising:
a circuit board including first connectors, a second connector, and a third connector connected to an external device;
a plurality of memory devices mounted on a first surface of the circuit board, and connected to the first connectors;
a power management integrated circuit (PMIC) mounted on a second surface of the circuit board, wherein the PMIC is configured to receive a first voltage through the second connector, configured to generate a second voltage using the first voltage, and configured to provide the second voltage to the plurality of memory devices; and
a driver mounted on the first surface of the circuit board, wherein the driver is configured to control the plurality of memory devices and the PMIC based on a command and an address signal received through the third connector,
wherein the PMIC is further configured to adjust the second voltage based on a signal received through the third connector such that a voltage difference of the first voltage and the second voltage is reduced in a training mode of the memory module,
the plurality of memory devices includes a first group of memory devices disposed between the driver and a first edge portion of the first surface and a second group of memory devices disposed between the driver and a second edge portion of the first surface, and
the first surface is opposed to the second surface.

18. The memory module of claim 17, wherein the PMIC is further configured to receive the signal directly from the third connector, configured to detect the voltage difference, and configured to adjust the second voltage based on the detected voltage difference in the training mode, and
wherein each of the plurality of memory devices is a double data rate 5 (DDR5) synchronous dynamic random access memory (SDRAM).

19. The memory module of claim 17, wherein the PMIC is further configured to:
store a trimming control code to minimize the voltage difference between the first voltage and the second voltage in the training mode; and
generate the second voltage using the trimming control code and provide the second voltage to the plurality of memory devices in a normal mode of the memory module.

20. A memory system comprising:
a memory module; and
a memory controller configured to control the memory module,
wherein the memory module includes:
a circuit board including first connectors, a second connector, and a third connector connected to the memory controller;
a plurality of memory devices mounted on a first surface of the circuit board, and connected to the first connectors; and
a power management integrated circuit (PMIC) mounted on a second surface of the circuit board, wherein the PMIC is configured to receive a first voltage through the second connector, configured to generate a second voltage using the first voltage, and configured to provide the second voltage to the plurality of memory devices, and
a driver mounted on the first surface of the circuit board,
wherein the PMIC is further configured to adjust the second voltage based on a signal received through the third connector such that a voltage difference of the first voltage and the second voltage is reduced in a training mode of the memory module, and
wherein the first surface is opposed to the second surface.

* * * * *